(12) United States Patent
Nabatame et al.

(10) Patent No.: US 9,825,180 B2
(45) Date of Patent: Nov. 21, 2017

(54) THIN-FILM TRANSISTOR AND METHOD FOR MANUFACTURING SAME

(71) Applicant: National Institute for Materials Science, Tsukuba-shi, Ibaraki (JP)

(72) Inventors: Toshihide Nabatame, Tsukuba (JP); Kazuhito Tsukagoshi, Tsukuba (JP); Shinya Aikawa, Tsukuba (JP); Toyohiro Chikyo, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 0 days.

(21) Appl. No.: 15/248,567

(22) Filed: Aug. 26, 2016

(65) Prior Publication Data
US 2016/0365455 A1 Dec. 15, 2016

Related U.S. Application Data

(62) Division of application No. 14/889,919, filed as application No. PCT/JP2014/062188 on May 2, 2014.

(30) Foreign Application Priority Data

May 9, 2013 (JP) .................................. 2013-099284
Jul. 3, 2013 (JP) .................................. 2013-139425
Jan. 31, 2014 (JP) .................................. 2014-016266

(51) Int. Cl.
*H01L 29/78* (2006.01)
*H01L 29/786* (2006.01)
(Continued)

(52) U.S. Cl.
CPC .... *H01L 29/7869* (2013.01); *H01L 21/02554* (2013.01); *H01L 21/02565* (2013.01);
(Continued)

(58) Field of Classification Search
CPC ........... H01L 29/7869; H01L 29/78609; H01L 21/02565; H01L 21/40; H01L 29/78693; H01L 29/66969
See application file for complete search history.

(56) References Cited

U.S. PATENT DOCUMENTS 8,232,552 B2 7/2012 Yano et al.
8,445,903 B2 5/2013 Inoue et al.
(Continued)

FOREIGN PATENT DOCUMENTS

JP 2005-043482 A 2/2005
JP 2008-243928 A 10/2008
(Continued)

OTHER PUBLICATIONS

Office Action issued in the corresponding Japanese Application No. 2015-515874 dated Aug. 26, 2016.
(Continued)

*Primary Examiner* — Roy Potter
*Assistant Examiner* — Paul Patton
(74) *Attorney, Agent, or Firm* — Morgan, Lewis & Bockius LLP

(57) ABSTRACT

The present invention provides a thin-film transistor in which transistor characteristics such as drain current and threshold voltage are improved, and a method of manufacturing the same. The present invention provides a thin-film transistor provided with a source electrode (108), a drain electrode (109), a semiconductor layer (105), a gate electrode (103), and an insulating layer (104); wherein the semiconductor layer (105) contains a composite metal oxide obtained by adding to a first metal oxide an oxide having an oxygen dissociation energy that is at least 200 kJ/mol greater than the oxygen dissociation energy of the first metal oxide, whereby the amount of oxygen vacancy is controlled; and
(Continued)

the insulating layer (104) is provided with an SiO$_2$ layer, a high-permittivity first layer, and a high-permittivity second layer, whereby the dipoles generated at the boundary between the SiO$_2$ layer and the high-permittivity layers are used to control the threshold voltage.

4 Claims, 13 Drawing Sheets

(51) Int. Cl.
*H01L 29/66* (2006.01)
*H01L 21/02* (2006.01)
*H01L 21/40* (2006.01)
*H01L 29/423* (2006.01)
*H01L 29/49* (2006.01)
*H01L 29/51* (2006.01)

(52) U.S. Cl.
CPC ........ *H01L 21/02631* (2013.01); *H01L 21/40* (2013.01); *H01L 29/42356* (2013.01); *H01L 29/4908* (2013.01); *H01L 29/513* (2013.01); *H01L 29/517* (2013.01); *H01L 29/66969* (2013.01); *H01L 29/78609* (2013.01); *H01L 29/78693* (2013.01)

(56) References Cited

U.S. PATENT DOCUMENTS

| | | |
|---|---|---|
| 2005/0017244 A1 | 1/2005 | Hoffman et al. |
| 2005/0017302 A1 | 1/2005 | Hoffman |
| 2007/0267699 A1 | 11/2007 | Hoffman |
| 2008/0023703 A1* | 1/2008 | Hoffman ............ H01L 29/7869 257/59 |
| 2010/0006833 A1 | 1/2010 | Ha et al. |
| 2010/0025680 A1 | 2/2010 | Shino et al. |
| 2010/0065835 A1 | 3/2010 | Inoue et al. |
| 2010/0155717 A1 | 6/2010 | Yano et al. |
| 2010/0258794 A1 | 10/2010 | Iwasaki et al. |
| 2010/0295042 A1 | 11/2010 | Yano et al. |
| 2011/0198586 A1 | 8/2011 | Inoue et al. |
| 2011/0248270 A1 | 10/2011 | Fukumoto et al. |
| 2012/0033152 A1 | 2/2012 | Ha et al. |
| 2012/0058598 A1 | 3/2012 | Yamazaki |
| 2012/0220077 A1 | 8/2012 | Ha et al. |
| 2013/0075720 A1 | 3/2013 | Ahn et al. |
| 2013/0234134 A1 | 9/2013 | Inoue et al. |

FOREIGN PATENT DOCUMENTS

| | | |
|---|---|---|
| JP | 2008-311342 A | 12/2008 |
| JP | 2009-054609 A | 3/2009 |
| JP | 2010-165922 A | 7/2010 |
| JP | 2012-191023 A | 10/2012 |
| JP | 2013-058559 A | 3/2013 |
| JP | 5168599 B | 3/2013 |
| WO | 2010/047077 A1 | 3/2012 |

OTHER PUBLICATIONS

Park et al., Device performance and bias instability of Ta doped InZnO thin film transistor as a function of process pressure, Applied Physics Letters, 102: 102102 (2013).

Nomura et al., Room-temperature fabrication of transparent flexible thin-film transistors using amorphous oxide semiconductors, Nature, 432:488-492 (2004).

Jeon et al., Short channel device performance of amorphous InGaZnO thin film transistor, Applied Physics Letters, 99: 082104 (2011).

Iwamoto et al., Experimental evidence for the flatband voltage shift of high-k metal-oxide-semiconductor devices due to the dipole formation at the high-k Si O 2 interface, Applied Physics Letters, 92: 132907 (2008).

Kita et al., Origin of electric dipoles formed at high-k / SiO 2 interface, Applied Physics Letters, 94: 132902 (2009).

International Search Report issue in International application No. PCT/JP2014/062188, dated Jun. 24, 2014.

Office Action issued in corresponding Japanese Patent Application No. 2016-213693, dated Sep. 7, 2017.

* cited by examiner

THIN-FILM TRANSISTOR AND METHOD FOR MANUFACTURING SAME

TECHNICAL FIELD

This application claims priority from Japanese Patent Application No. 2013-099284, filed on May 9, 2013, Japanese Patent Application No. 2013-139425, filed on Jul. 3, 2013, and Japanese Patent Application No. 2014-016266, filed on Jan. 31, 2014, the contents of which are incorporated herein by reference.

The present invention relates to a thin-film transistor and a method of manufacturing the same.

BACKGROUND ART

A number of thin-film transistors (TFTs) are used as switching elements of a liquid crystal display employing an active matrix driving system and an organic electroluminescence (EL) display.

As the TFT, one in which amorphous silicon or polysilicon is used for a semiconductor layer (channel layer) is known. Recently, in order to improve various characteristics, TFTs in which In (indium)-Zn (zinc)-O (IZO)-based, In—Ga (gallium)-Zn—O (IGZO)-based or Sn (tin)-Zn—O (SZO)-based metal oxide is used for the semiconductor layer are being studied (for example, refer to Patent Literature 1).

Since such thin-film transistors are n-type conductive and exhibit higher channel mobility than those of amorphous silicon and polysilicon, they can be preferably used as switching elements of a high-definition display and a large-screen display. While various theories are being discussed for the mechanism of the n-type conduction, it is mainly said that oxygen vacancy is introduced into the indium oxide structure by oxygen elimination, and as a result, it generates charges to serve as a semiconductor layer. Moreover, since the semiconductor layer having metal oxide as the forming material does not exhibit p-type conduction in principle, and accordingly, has extremely small off-current, use of this thin-film transistor achieves the advantage that power consumption can be reduced.

There is, however, a problem that as to IZO-based, IGZO-based and SZO-based metal oxides which are the metal oxides disclosed in Patent Literature 1, contained Zn, Ga and Sn are liable to react with moisture in the air, as a result, form suboxide which is unstable as the oxide structure for each, and the oxygen vacancy amount cannot be adjusted, which largely deteriorates the transistor characteristics including the drain current, the threshold voltage and the like. Moreover, there is also a problem that while in view of ease of production, silicon oxide ($SiO_2$) is used as the gate insulating film, a thick film thereof is needed to suppress the leakage current between the gates, and as a result, the gate voltage applied to control the electron mobility increases.

To solve these, Patent Literature 2 discloses use of one obtained by adding, to a substance containing at least one element of zinc and tin, at least one of yttrium, niobium, tantalum, hafnium, lanthanum, scandium, vanadium, titanium, magnesium, aluminum, gallium and silicon as metal oxide. Moreover, in order to suppress change in threshold voltage caused by increase of carriers due to the breakdown effect and the radiation effect based on plasma damage in the fabrication stage of the thin-film transistor, it is disclosed that zinc oxide is doped with ions of at least one of gallium, indium, tin, zirconium, hafnium and vanadium (Patent Literature 3). Furthermore, there are reported the electrical characteristics of an oxide film transistor of IZO-based metal oxide doped with tantalum (Non Patent Literature 1). These, however, include the major problem that since zinc and/or tin are included as the main elements in all of the aforementioned cases, the process suffers restriction to a large extent in order to suppress the formation of suboxide in the fabrication stage of the thin-film transistor.

Furthermore, it is also reported that indium oxide doped with any of tin, titanium and tungsten is used as metal oxide instead of IZO or IGZO (Patent Literature 4). As to the oxide film transistor in which indium oxide doped with any of titanium and tungsten disclosed in the aforementioned literature is used as metal oxide, there is, however, the major problem that it is exceedingly difficult to adjust the amount of oxygen vacancy introduced into indium oxide which is the main structure in the fabrication stage of the metal oxide, which loads restriction on the manufacturing process.

Moreover, to solve these, Non Patent Literature 2 reports that an IGZO-based thin-film transistor using yttrium oxide ($Y_2O_3$) having the permittivity of 16 which is larger as compared with the permittivity of 3.9 of $SiO_2$ as the gate insulating film is fabricated, and thereby, the thickness of the gate insulating film can be made thin and the gate voltage can be reduced. Moreover, there are reported the transistor characteristics of an IGZO-based thin-film transistor using aluminum oxide ($Al_2O_3$) as the gate insulating film (Non Patent Literature 3). Furthermore, it is disclosed to make the gate insulating film of a thin-film transistor be a layered structure of a high permittivity film and a low permittivity film (Patent Literature 5). In all of the aforementioned cases, however, while there is expected the effect that the leakage current can be suppressed with a high permittivity film, i.e., that the physical film thickness can be made thicker as compared with $SiO_2$ by using metal oxide with high permittivity as the gate insulating film in the case where the effective electric field applied to the gate insulating film is the same, there is a problem that since the permittivity of the high permittivity film is not more than 20, the effect is insufficient. Moreover, there is the major problem that control of the threshold voltage which is a noticeable parameter required for the thin-film transistor is not studied at all.

Furthermore, it is reported that in a complementary metal oxide semiconductor (CMOS) device, when using the gate insulating film of layer stack of $Al_2O_3/SiO_2$ which is a high permittivity film, the flat band voltage shifts due to dipoles at the $Al_2O_3/SiO_2$ interface (Non Patent Literature 4). Moreover, it is reported that in a layered structure using lanthanum oxide ($La_2O_3$) and $Y_2O_3$ as high permittivity materials along with the $SiO_2$ layer, dipoles of the opposite direction to that of $Al_2O_3/SiO_2$ are generated and the flat band voltage shifts to the opposite direction (Non Patent Literature 5). There is, however, the major problem that all of the aforementioned CMOSs have the structure of Si channel/$SiO_2$/the high permittivity film, and that shift of the flat band voltage in the Si channel/the high permittivity film/$SiO_2$ structure is not reported, which loads restriction on the structure.

CITATION LIST

Patent Literature

PATENT LITERATURE 1: JP-B-5168599
PATENT LITERATURE 2: JP-A-2013-70052
PATENT LITERATURE 3: JP-A-2010-21520
PATENT LITERATURE 4: JP-A-2008-192721
PATENT LITERATURE 5: JP-A-2005-43482

Non Patent Literature

NON PATENT LITERATURE 1: APPLIED PHYSICS LETTERS 102, 102102 (2013).
NON PATENT LITERATURE 2: Nature 432,488 (2004).
NON PATENT LITERATURE 3: Applied Physics Letters 99, 082104 (2011).
NON PATENT LITERATURE 4: Applied Physics Letters 92, 132907 (2008).
NON PATENT LITERATURE 5: Applied Physics Letters 94, 132902 (2009).

SUMMARY OF INVENTION

Technical Problem

The present invention is devised in view of the aforementioned circumstances, and an object thereof is to provide a thin-film transistor in which the oxygen vacancy amount as the aforementioned problem is controlled by adding, to a first metal oxide such as indium oxide, an oxide having oxygen dissociation energy of a metal (Me)-O bond or a nonmetal-O bond that is at least 200 kJ/mol greater than the oxygen dissociation energy of the first metal oxide, and moreover, the threshold voltage is controlled using dipoles generated at the interface due to formation of a high permittivity layer in contact with a $SiO_2$ layer, based on the knowledge of the present inventors.

Solution to Problem

According to a first aspect of the present invention, there is provided a thin-film transistor including: a source electrode and a drain electrode; a semiconductor layer provided in contact with the source electrode and the drain electrode; a gate electrode provided corresponding to a channel between the source electrode and the drain electrode; and an insulating layer provided between the gate electrode and the semiconductor layer, wherein the semiconductor layer is a composite metal oxide obtained by adding, to a first metal oxide capable of generating an electron carrier by oxygen vacancy introduced, an oxide having oxygen dissociation energy that is at least 200 kJ/mol greater than oxygen dissociation energy of the first metal oxide.

Herein, the oxygen dissociation energy of the oxide may be at least 255 kJ/mol greater than the oxygen dissociation energy of the first metal oxide.

Moreover, the first metal oxide may contain at least one selected from the group consisting of indium, gallium, zinc and tin.

Moreover, the oxide may contain a second metal oxide composed of oxide of at least one metal selected from the group consisting of zirconium (Zr) and praseodymium (Pr).

Moreover, the oxide may contain a second metal oxide composed of oxide of at least one metal selected from the group consisting of silicon (Si), tantalum (Ta), lanthanum (La) and hafnium (Hf).

Moreover, a content of the oxide may be greater than 0 and not more than 50 wt %.

Moreover, a content of the oxide may be greater than 0 and not more than 5 wt %.

Moreover, the semiconductor layer may be amorphous.

Moreover, a thickness of the semiconductor layer may be in a range not less than 5 nm and not more than 20 nm.

Moreover, the oxide may contain at least one element selected from the group consisting of boron (B) and carbon (C).

Moreover, a content of boron (B) and carbon (C) contained in the composite metal oxide may be greater than 0 and not more than 10 wt %.

According to a second aspect of the present invention, there is provided a method of manufacturing any of the aforementioned thin-film transistors, wherein the semiconductor layer is formed at 10° C. or more and 600° C. or less.

Herein, the semiconductor layer may be formed at 10° C. or more and 400° C. or less.

Moreover, the semiconductor layer may be formed at 10° C. or more and 200° C. or less.

According to a third aspect of the present invention, in any of the aforementioned thin-film transistors, there is provided the thin-film transistor, wherein an additional oxide having oxygen dissociation energy that is smaller than the oxygen dissociation energy of the first metal oxide is added to the semiconductor layer in an amount smaller than an addition amount of the oxide having the oxygen dissociation energy that is at least 200 kJ/mol greater than the oxygen dissociation energy of the first metal oxide.

Herein, a content of the additional oxide may be greater than 0 and not more than 10 wt %.

Moreover, the additional oxide may be at least one oxide selected from the group consisting of lead oxide, palladium oxide, platinum oxide, sulfur oxide, antimony oxide, strontium oxide and ytterbium oxide.

According to a fourth aspect of the present invention, there is provided a method of manufacturing any of the aforementioned thin-film transistors in which the additional oxide is added to the semiconductor layer, wherein the semiconductor layer may be formed at 10° C. or more and 600° C. or less.

Moreover, the semiconductor layer may be formed at 10° C. or more and 500° C. or less.

According to a fifth aspect of the present invention, there is provided a thin-film transistor including: a source electrode and a drain electrode; a semiconductor layer provided in contact with the source electrode and the drain electrode; a gate electrode provided corresponding to a channel between the source electrode and the drain electrode; and an insulating layer provided between the gate electrode and the semiconductor layer, wherein the insulating layer has layer stack of, in order from the gate electrode side, a silicon oxide layer, a high-permittivity first layer which is provided in contact with the silicon oxide layer and has permittivity that is higher than that of the silicon oxide layer, and a high-permittivity second layer having permittivity that is higher than that of the silicon oxide layer.

Furthermore, there is provided a thin-film transistor including: a source electrode and a drain electrode; a semiconductor layer provided in contact with the source electrode and the drain electrode; a gate electrode provided corresponding to a channel between the source electrode and the drain electrode; and an insulating layer provided between the gate electrode and the semiconductor layer, wherein the insulating layer has layer stack of, in order from the semiconductor layer side, a silicon oxide layer, a high-permittivity first layer which is provided in contact with the silicon oxide layer and has permittivity that is higher than that of the silicon oxide layer, and a high-permittivity second layer having permittivity that is higher than that of the silicon oxide layer.

Herein, also in any of the aforementioned thin-film transistors, the permittivity of the high-permittivity second layer may be higher than the permittivity of the high-permittivity first layer.

Moreover, the high-permittivity first layer may be formed of at least one metal oxide selected from the group consisting of aluminum oxide, hafnium oxide, zirconium oxide, titanium oxide, tantalum oxide, niobium oxide, rare-earth oxide, magnesium oxide and strontium oxide, and silicate oxide or silicon oxynitride.

Moreover, the high-permittivity second layer may be formed of metal oxide having permittivity of 20 or more.

Moreover, a thickness of the high-permittivity first layer may be 0.6 nm or more.

Moreover, a thickness of the silicon oxide film may be 0.6 nm or more.

According to a sixth aspect, there is provided a method of manufacturing the thin-film transistor of the fifth aspect, wherein the semiconductor layer is formed at 10° C. or more and 400° C. or less.

Moreover, the semiconductor layer may be formed at 10° C. or more and 200° C. or less.

Advantageous Effects of Invention

According to the present invention, there can be provided a thin-film transistor excellent in transistor characteristics by using a semiconductor layer of a composite metal oxide obtained by adding, to a first metal oxide such as indium oxide, an oxide having oxygen dissociation energy of a metal (Me)-O bond or a nonmetal-O bond that is at least 200 kJ/mol greater than the oxygen dissociation energy of the first metal oxide. Moreover, as to the thin-film transistor in which an additional oxide is further added to the semiconductor layer, there can be provided a thin-film transistor further excellent in transistor characteristics since one in the amorphous state can be easily obtained as the oxide layer. Furthermore, there can be provided a thin-film transistor with low leakage current in which the threshold voltage is controlled by using dipoles generated at the interface due to the formation of a high permittivity layer in contact with the $SiO_2$ layer and employing a structure in which the high permittivity layer having permittivity of 20 or more is used.

Other objects, features and advantages of the present invention will be apparent from the following description of embodiments of the present invention regarding the appended drawings.

DESCRIPTION OF EMBODIMENTS

Hereafter, while thin-film transistors according to various modes for carrying out the present invention and methods of manufacturing those are described with reference to the drawings, the present invention is not limited to these embodiments. Notably, in all of the drawings below, dimensions and their ratios of constituents are presented different from those in an actual product for ease in seeing the drawings.

[Thin-Film Transistor of First Embodiment]

A thin-film transistor of a first embodiment includes: a source electrode and a drain electrode; a semiconductor layer provided in contact with the source electrode and the drain electrode; a gate electrode provided corresponding to a channel between the source electrode and the drain electrode; and an insulating layer provided between the gate electrode and the semiconductor layer, wherein the semiconductor layer is a composite metal oxide composed of a first metal oxide, and an oxide in which dissociation energy of oxygen added to the first metal oxide is at least 200 kJ/mol greater than oxygen dissociation energy of the first metal oxide.

Moreover, a method of manufacturing the thin-film transistor of the first embodiment has a step of forming the semiconductor layer at 10° C. or more and 400° C. or less, 600° C. or less depending on the condition, when manufacturing the aforementioned thin-film transistor.

Figure 1:
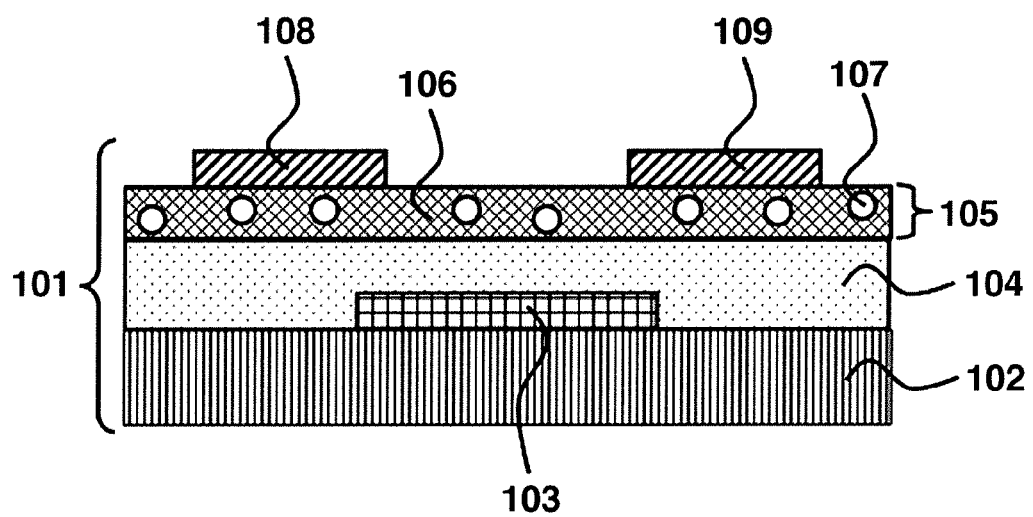
FIG. 1 is a schematic cross-sectional view of a thin-film transistor according to a first embodiment of the present invention.

FIG. 1 is a schematic cross-sectional view of a thin-film transistor 101 according to the first embodiment. As a substrate 102, one formed of a known forming material can be used, and any of one having light transmissivity and one not having light transmissivity can be used. For example, an inorganic substrate having a forming material such as alkali silicate-based glass, quartz glass and silicon nitride; a silicon substrate; a metal substrate whose surface undergoes insulation processing; a resin substrate having a forming material such as polyester resin such as acrylic resin, polycarbonate resin, PET (poly(ethylene terephthalate)) and PBT (poly(butylene terephthalate)); and a paper-made substrate are variously used. Moreover, it is sufficient to be a substrate having a forming material such as a composite material obtained by combining these materials. The thickness of the substrate 102 can be properly configured depending on its design.

The thin-film transistor 101 is a so-called bottom-gate transistor. The thin-film transistor 101 has a gate electrode 103 provided on the substrate 102, an insulating layer 104 provided to cover the gate electrode 103, a semiconductor layer 105 provided on the upper surface of the insulating layer 104, and a source electrode 108 and a drain electrode 109 provided on the upper surface of the semiconductor layer 105 to be in contact with the semiconductor layer 105. The gate electrode 103 is provided corresponding to a channel region of the semiconductor layer 105 (at a position of planarly overlapping with the channel region). Moreover, the semiconductor layer 105 is composed of a composite metal oxide obtained by adding, to a first metal oxide 106, a second metal oxide 107. Notably, the semiconductor layer may contain a component other than the second metal oxide 107 and an irresistible impurity in the nature of things as long as the operation and the effect of the present invention do not suffer exceedingly harmful influence. The same holds true for the case where an oxide of a nonmetallic element is added as described in another embodiment mentioned below. Moreover, while for convenience of ease of illustration in FIG. 1, the semiconductor layer 105 (composite metal oxide) is drawn in the mode where particles of the second metal oxide 107 can be seen as if they are dispersed in the first metal oxide 106, it should be noted that the second metal oxide is uniformly added, in other words, doped into the first metal oxide in reality, and thereby, the composite metal oxide is made be a uniform substance.

As the gate electrode 103, the source electrode 108 and the drain electrode 109, ones formed of a typically known material can be used. Examples of the forming material of these electrodes can include, for example, a metal material such as aluminum (Al), gold (Au), silver (Ag), copper (Cu), nickel (Ni), molybdenum (Mo), tantalum (Ta) and tungsten (W), alloy of these, and conductive oxide such as indium tin oxide (ITO) and zinc oxide (ZnO). Moreover, in these electrodes, for example, a layered structure of two or more layers may be formed by plating their surfaces with a metal material.

The gate electrode 103, the source electrode 108 and the drain electrode 109 may be ones formed of the same forming material, or may be ones formed of different forming materials. For the reason that they are easily manufactured, the source electrode 108 and the drain electrode 109 preferably have the same forming material.

The insulating layer 104 may be formed using any of an inorganic material and an organic material as long as it has an insulating properties and can electrically insulates the gate electrode 103 from the source electrode 108 and the drain electrode 109. Examples of the inorganic material can include, for example, typically known insulative oxide, nitride, and oxynitride such as $SiO_2$, $SiN_x$, $SiON$, $Al_2O_3$ and $HfO_2$. Examples of the organic material can include, for example, acrylic resin, epoxy resin, silicon resin, fluorine-based resin and the like. For the reason of ease of manufacturing and processing, the organic material is preferably a thermo-setting resin material.

The semiconductor layer 105 is composed of the first metal oxide, and the oxide in which the dissociation energy of the added oxygen is at least 200 kJ/mol greater than the oxygen dissociation energy of the first metal oxide. Among these, the first metal oxide is a substance having the nature of semiconductor which can form electron carriers by oxygen vacancy introduced. Examples of the first metal oxide can include a metal oxide containing at least one of indium, zinc and tin. Moreover, as the first metal oxide, a metal oxide containing at least one of indium, gallium, zinc and tin may be used. Above all, indium for which oxygen vacancy is easy to be introduced at low temperature is still preferable.

When indium oxide ($In_2O_3$) is used as the first metal oxide, since the oxygen dissociation energy of indium oxide is small to be 346±30 kJ/mol, oxygen is easily eliminated from indium oxide and oxygen vacancy is liable to be formed. Nevertheless, too much oxygen vacancy amount causes change from the semiconductor-like nature to the metallic nature, not being suitable for the semiconductor layer. The present inventors intensively conducted studies for solving this problem, and have found that to control the oxygen vacancy amount of indium oxide, it is sufficient to add the second metal oxide which is a metal oxide having oxygen dissociation energy greater than the oxygen dissociation energy of indium oxide, or a nonmetallic element which is equivalent thereto as mentioned later. Specifically, when a metal oxide having oxygen dissociation energy not less than 725 kJ/mol, still preferably not less than 780 kJ/mol, is used as the second metal oxide or the nonmetallic element, control of the oxygen vacancy amount of indium oxide is made easy. Notably, when the first metal oxide is generalized to substances other than indium oxide, it is sufficient that as the second metal oxide, it is sufficient to use one having oxygen dissociation energy that is at least 200 kJ/mol, still preferably at least 255 kJ/mol greater as compared with that of the first metal oxide. While the second metal oxide is used in the present embodiment, examples of the specifically usable second metal oxide can include zirconium oxide (Zr—O), praseodymium oxide (Pr—O), lanthanum oxide (La—O), silicon oxide (Si—O), tantalum oxide (Ta—O) and hafnium oxide (Hf—O) as presented in Table 1 in which metal oxides having oxygen dissociation energy not less than 780 kJ/mol are collected and Table 2 in which metal oxides having oxygen dissociation energy not less than 725 kJ/mol and not more than 780 kJ/mol are collected.

TABLE 1

| Second Metal Oxide | Oxygen Dissociation Energy (kJ/mol) |
|---|---|
| La—O | 798 |
| Si—O | 799.6 ± 13.4 |
| Hf—O | 801 ± 1.3 |
| Ta—O | 839 |

TABLE 2

| Second Metal Oxide | Oxygen Dissociation Energy (kJ/mol) |
|---|---|
| Pr—O | 740 |
| Zr—O | 766.1 ± 10.6 |

As the second metal oxide added for making the first metal oxide be the semiconductor layer having a suitable oxygen vacancy amount in the first embodiment, in particular, the second metal oxide of being not less than 780 kJ/mol presented in Table 1 is still preferable. Specifically, examples thereof can include lanthanum oxide (La—O), silicon oxide (Si—O), tantalum oxide (Ta—O) and hafnium oxide (Hf—O).

Moreover, the content of the second metal oxide added to the first metal oxide for making the first metal oxide be the semiconductor layer having a suitable oxygen vacancy amount is excellent to be in a range greater than 0 and not more than 50 wt %. In particular, when the content of the second metal oxide added to the first metal oxide is in a range greater than 0 and not more than 5 wt %, production can be performed at low temperature not more than 200° C.

Notably, the content of the second metal oxide can be calculated as the ratio of the weight of the second metal oxide relative to the total of the weight of the first metal oxide and the weight of the second metal oxide (the weight of the second metal oxide/(the weight of the first metal oxide+the weight of the second metal oxide)×100).

For In—Zn—O-based or In—Ga—Zn—O-based metal oxide, the semiconductor layer is liable to be polycrystalline in its formation. Therefore, in a typically known thin-film transistor, the surface of the semiconductor layer is not flat caused by crystal grains contained in the semiconductor layer. Moreover, caused by such crystal grains the semiconductor layer of a typically known oxide film transistor results in decrease of electric conductivity in the planer direction. Accordingly, to achieve planarization of the surface of the semiconductor layer and high electric conductivity, the semiconductor layer preferably has an amorphous structure.

Moreover, the thickness of the semiconductor layer 105 is still preferably in a range not less than 5 nm and not more than 20 nm. Notably, for the present embodiment, the thickness of the semiconductor layer 105 was measured using a quartz-oscillation film thickness gauge which was disposed in the sputtering chamber in which the semiconductor layer 105 was formed and was mainly for film thickness calibration.

[Thin-Film Transistor of Second Embodiment]

The composite metal oxide composing the semiconductor layer 105 is not limited to ones obtained by adding, to the first metal oxide, the second metal oxide. Specifically, an element which forms an oxide having dissociation energy greater as compared with that of the first metal oxide may be added. Specifically, the composite metal oxide may be, for example, one obtained by adding an oxide of at least one element of boron (B) and carbon (C) (namely, it should be noted that herein, the "composite metal oxide" is used to mean an "oxide obtained by compounding, to a metal oxide, an element having greater dissociation energy from oxygen"). This is because the oxygen dissociation energy of the B—O bond of 809 kJ/mol and the oxygen dissociation energy of the C—O bond of 1076.38±0.67 kJ/mol are large, and accordingly, the amount of oxygen vacancy introduced into the first metal oxide can be easily controlled. While a thin-film transistor 101' of another embodiment of the present invention illustrated in FIG. 2 basically has the same structure as that of the thin-film transistor 101 in FIG. 1, there is a difference in that a semiconductor layer 105' corresponding to the semiconductor layer 105 in FIG. 1 is a composite metal oxide obtained by adding, to the first metal oxide 106, an oxide 110 of boron and/or carbon. Notably, since ones in FIG. 2 which are given the same reference numerals as those of elements in FIG. 1 are the same as the corresponding elements in FIG. 1, their description is omitted.

Figure 2:
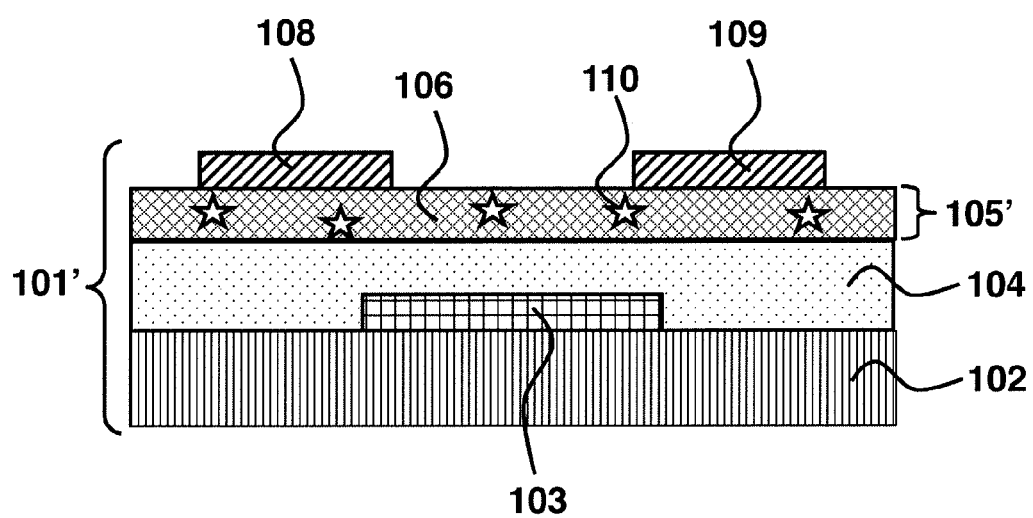
FIG. 2 is a schematic cross-sectional view of a thin-film transistor according to a second embodiment of the present invention.

Notably, while as noted in the description of the first embodiment with reference to FIG. 1, for convenience of ease of illustration also in FIG. 2, the semiconductor layer 105' (composite metal oxide) is drawn in the mode where particles of the oxide 110 of boron or carbon can be seen as if they are dispersed in the first metal oxide 106, also in this case, it should be noted that the oxide thereof is uniformly added, in other words, doped into the first metal oxide in reality, and thereby, the composite metal oxide is made be a uniform substance.

While boron (B) oxide is added to indium oxide ($In_2O_3$) which is the first metal oxide, for example, by ion implantation, this addition method can control the addition amount and the depth by varying the acceleration voltage. The content is still preferably greater than 0 and not more than 10 wt %. Herein, the content of boron (B) is calculated as the ratio of the weight of boron (B) relative to the weight of the composite metal oxide (the weight of boron (B)/the weight of the composite metal oxide×100). Notably, in this case, the ion implantation is performed by implanting not boron oxide but ions of boron into the first metal oxide. The boron ions become boron oxide in the first metal oxide. As above, when oxide is added into the first metal oxide, the oxide itself is not necessarily needed to be added in the addition processing operation itself, but, for example, processing of adding an element composing the oxide other than oxygen can also be performed, so that it is made to be the oxide inside the first metal oxide. Herein, it should be noted that the addition, in this way, performed in the mode which is to be present in the form of the oxide inside the first metal oxide irrespective of the mode in the addition processing operation is referred to as "addition of the oxide".

Moreover, addition of carbon (C) to indium oxide ($In_2O_3$) which is the first metal oxide is performed by a co-sputtering method using an $In_2O_3$ target and a graphite target, the addition amount can be controlled by varying the ratio between the sputtering powers, and the content is still preferably greater than 0 and not less than 10 wt %. Herein, the content of carbon (C) is calculated as the ratio of the weight of carbon (C) relative to the weight of the composite metal oxide (the weight of carbon (C)/the weight of the composite metal oxide×100).

Notably, the semiconductor layer can also be formed based on a composite metal oxide simultaneously using both of the second metal oxide in the embodiment first described and the oxide of non-metal described in this embodiment as the oxides having the large oxygen dissociation energy. Moreover, when the addition processing of an oxide having large oxygen dissociation energy in the present invention is performed, both kinds of oxides can irresistibly co-exist in the semiconductor layer made of the composite metal oxide depending on the kind of processing. For example, when a thin film of such a semiconductor layer is fabricated by a solution method such as a sol-gel method, carbon highly possibly remains in the thin film. It should be noted that such a case is also included in the present invention.

[Embodiment of Method for Manufacturing Thin-Film Transistor]

Next, a method of manufacturing the thin-film transistor 101 of the present embodiment is described. The semiconductor layer of the thin-film transistor of the present embodiment can also be formed by using a physical deposition method (or a physical vapor growth method).

Herein, examples of the physical deposition method can include a deposition method and a sputtering method. As the deposition method, a vacuum deposition method, a molecular beam deposition method (MBE), an ion plating method, an ion beam deposition method and the like can be exemplarily presented. Moreover, as the sputtering method, a conventional sputtering, a magnetron sputtering, an ion beam sputtering, an ECR (electron cyclotron resonance) sputtering, a reactive sputtering and the like can be exemplarily presented. In the case of using plasma in the sputtering method, a film deposition method such as a reactive sputtering method, a DC (direct current) sputtering method, and a high frequency (RF) sputtering method can be used.

Furthermore, one manufactured using the following manufacturing method is preferable. When the following manufacturing method is used, a thin-film transistor with higher quality can be manufactured.

In the method of manufacturing the thin-film transistor 101 of the present embodiment, after the gate electrode 103 and the insulating layer 104 are formed on the substrate 102 by a typically known method, the semiconductor layer 105 is formed. In the manufacturing method of the present embodiment, the semiconductor layer 105 is manufactured by a physical deposition method using a target which is a sintered body containing powder of the first metal oxide, and powder of the oxide having the oxygen dissociation energy that is at least 200 kJ/mol greater than the oxygen dissociation energy of the first metal oxide, and mixed gas of rare gas and oxygen. The description is herein made with the sputtering method used as the physical deposition method.

For example, when In—Si—O-based metal oxide is employed as the semiconductor layer 105, as to the target, it is excellent to employ a sintered body of powder of indium oxide and powder of silicon oxide. Moreover, in the target, an impurity such as an additive (such as metal oxide) by % by weight or less of the silicon oxide may be mixed. For example, there is caused no problem even when in the target, metal oxide (such as zinc oxide) other than indium oxide and silicon oxide is mixed at a ratio (weight ratio) not more than the silicon oxide content in the whole target as an unintended impurity.

In such a case, the content of the silicon oxide contained in the sintered body is excellent to be greater than 0 wt % and not more than 50 wt %. Moreover, the silicon oxide content is preferably greater than 0 wt % and not more than 5 wt %.

When indium oxide is the "host material" and zinc oxide and gallium oxide are the "guest materials", in In—Zn—O-based or In—Ga—Zn—O-based metal oxide which is typically known oxide semiconductor, 20% to 30% of guest material (zinc oxide and/or gallium oxide) relative to the host material (indium oxide) is mixed.

On the contrary, for the semiconductor layer 105 of the thin-film transistor 101 of the present embodiment, thin film formation is performed using the aforementioned sintered body as the target. Since in the thin-film transistor 101 manufactured by the manufacturing method of the present embodiment, the silicon oxide content is still preferably greater than 0 wt % and not more than 5 wt % as mentioned above, the oxide semiconductor of the semiconductor layer 105 in the case of this preferable composition has exceedingly small content of the guest material (silicon oxide) relative to the host material (indium oxide) as compared with a typically known oxide semiconductor.

Moreover, in the method of manufacturing the thin-film transistor 101, a mixed gas of rare gas and oxygen is used as process gas. Examples of the rare gas can include helium, neon, argon, krypton and xenon. Moreover, the process gas does not contain a compound having a hydrogen atom.

In the method of manufacturing the thin-film transistor of the present embodiment, based on the study by the inventors, it has been already found that when a semiconductor layer is formed using a target containing indium oxide and silicon oxide, high temperature is not needed for making metal oxide composing the semiconductor layer be an amorphous film. Therefore, in the method of manufacturing the thin-film transistor, a step of forming the semiconductor layer is performed at 10° C. or more and 200° C. or less, and thereby, an amorphous semiconductor layer can be formed. Moreover, by performing it at higher than 200° C. and 400° C. or less, a suitable crystallized semiconductor layer can also be formed. Furthermore, it is excellent to perform the step of forming the semiconductor layer at ambient temperature. Herein, "to perform at ambient temperature" means that heating is not applied for the step of forming the semiconductor layer and temperature adjustment of the working environment is not needed.

As the sputtering method employed in the method of manufacturing the thin-film transistor of the present embodiment, known one such as RF sputtering and DC sputtering can be used.

Moreover, as long as powder of indium oxide and powder of silicon oxide are used, the target may be a sintered body of a mixture of these powders, or may include sintered bodies of the individual powders. When a sintered body is formed for each of the powders of the metal oxides, the semiconductor layer can be formed by co-sputtering using the sintered bodies.

Even when as the first metal oxide instead of indium oxide, metal oxide obtained by combining zinc oxide and tin oxide, or indium oxide, gallium oxide, zinc oxide and tin oxide is used, by using the similar method to the above, the semiconductor layer in which the oxygen vacancy amount is controlled can be formed.

While silicon oxide is described as the second metal oxide, instead, also when each of zirconium oxide (Zr—O), praseodymium oxide (Pr—O), lanthanum oxide (La—O), tantalum oxide (Ta—O) and hafnium oxide (Hf—O) is used, the semiconductor layer can be formed in a process range corresponding to the magnitude of oxygen dissociation energy for each.

As above, the method of manufacturing the thin-film transistor of the present embodiment has been described.

[Thin-Film Transistor of Third Embodiment]

For the thin-film transistor of the present invention, an additional oxide having oxygen dissociation energy that is smaller than that of the first metal oxide can be added to the semiconductor layer in addition to the first metal oxide and the oxide having the oxygen dissociation energy that is at least 200 kJ/mol greater as compared with that of the first metal oxide described above. An addition amount of the additional oxide is set to be smaller than the addition amount of the oxide having the oxygen dissociation energy that is at least 200 kJ/mol greater as compared with that of the first metal oxide.

As having been already described near the tail of the description of [Thin-Film Transistor of First Embodiment], when the semiconductor layer is polycrystalline, the electric conductivity in the planar direction decreases, which causes deterioration of characteristics of the thin-film transistor. Addition of the aforementioned additional oxide enables that the semiconductor layer is set to the amorphous state at up to a higher semiconductor layer forming temperature as compared with the case of not adding the same.

While the present embodiment is hereafter described more specifically, the matter common to that in [Thin-Film Transistor of First Embodiment], [Thin-Film Transistor of Second Embodiment] and [Embodiment of Method for Manufacturing Thin-Film Transistor] is omitted from the description. Moreover, in the following description, [Thin-Film Transistor of First Embodiment] is the comparison target, and the description is made mainly for the additional matter to that. Nevertheless, it should be noted that the present embodiment is not limited to the addition of components to the [Thin-Film Transistor of First Embodiment], but can also be equivalently applied to the case where a nonmetallic oxide having large oxygen dissociation energy, such as boron and carbon, is used instead of the second metal oxide as described for [Thin-Film Transistor of Second Embodiment].

The composite metal oxide composing the semiconductor layer is one obtained by further adding, to one obtained by adding, to the first metal oxide, the second metal oxide having the sufficiently high oxygen dissociation energy as mentioned above, a third metal oxide (additional oxide) which has oxygen dissociation energy smaller than that of the first metal oxide and whose addition amount is smaller than that of the second metal oxide. The present inventors have found that the semiconductor layer becomes amorphous even in a high temperature range around 500° C. or 600° C. by controlling the oxygen vacancy amount with the second metal oxide, and in addition to this, by adding the third metal oxide. Specifically, examples of the third metal oxide can include lead oxide with 382.4±3.3 kJ/mol of oxygen dissociation energy, palladium oxide with 238.1±12.6 kJ/mol, platinum oxide with 418.6±11.6 kJ/mol, sulfur oxide with 517.90±0.05 kJ/mol, antimony oxide with 434±42 kJ/mol, strontium oxide with 426.3±6.3 kJ/mol, thallium oxide with 213±84 kJ/mol, ytterbium oxide with 387.7±10 kJ/mol and the like.

Herein, the content of the second metal oxide is calculated as the ratio of the weight of the second metal oxide relative to the total of the weight of the first metal oxide, the weight of the second metal oxide and the weight of the third metal oxide (the weight of the second metal oxide/(the weight of the first metal oxide+the weight of the second metal oxide+ the weight of the third metal oxide)×100), and the content of the third metal oxide is calculated as the ratio of the weight of the third metal oxide relative to the total of the weight of the first metal oxide, the weight of the second metal oxide and the weight of the third metal oxide (the weight of the third metal oxide/(the weight of the first metal oxide+the weight of the second metal oxide+the weight of the third metal oxide)×100).

Figure 3:
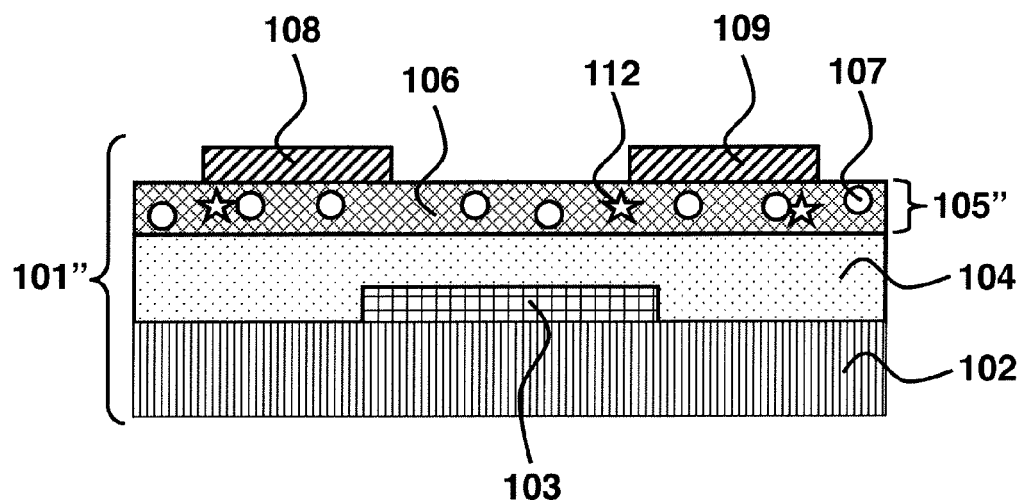
FIG. 3 is a schematic cross-sectional view of a thin-film transistor according to a third embodiment of the present invention.

A thin-film transistor 101" of the present embodiment for which a schematic cross-sectional view is illustrated in FIG. 3 basically has the same structure as that of the thin-film transistor 101 in FIG. 1 which is the first embodiment. It should be noted that while the semiconductor layer 105 in FIG. 3 is one obtained by adding, to the first metal oxide 106, the aforementioned second metal oxide 107, there is a difference in that a semiconductor layer 105" corresponding thereto is a composite metal oxide obtained by further adding, to the semiconductor layer 105 in FIG. 1, a third metal oxide 112 having oxygen dissociation energy that is smaller than that of the first metal oxide by an addition amount smaller than that of the second metal oxide. Notably, since the elements in FIG. 3 which are given the same reference numerals as those of the elements in FIG. 1 are the same as the corresponding elements in FIG. 1, their description is omitted.

Notably, while as noted in the description of the first embodiment with reference to FIG. 1, for convenience of ease of illustration also in FIG. 3, the semiconductor layer 105" (composite metal oxide) is drawn in the mode where the second metal oxide 107 and the third metal oxide 112 can be seen as if they are dispersed in the first metal oxide 106, also in this case, it should be noted that these two kinds of oxides are uniformly added, in other words, doped into the first metal oxide in reality, and thereby, the composite metal oxide is made be a uniform substance.

Addition of silicon oxide ($SiO_2$) which is the second metal oxide and ytterbium oxide ($Yb_2O_3$) which is the third metal oxide to indium oxide ($In_2O_3$) which is the first metal oxide is performed, for example, in a target fabrication stage in the sputtering method.

Moreover, the co-sputtering method using an In—Si—O target and an $Yb_2O_3$ target is performed, the addition amount can be controlled by varying the ratio between the sputtering powers, and the content of ytterbium oxide is still preferably greater than 0 and not more than 10 wt % with respect to the semiconductor layer.

According to the thin-film transistors of the present invention exemplified in FIG. 1, FIG. 2 and FIG. 3 as above, change in characteristics is suppressed by using the novel composite metal oxide as the semiconductor layer.

Moreover, a semiconductor device having the configuration as above is made have thin-film transistors in which change in characteristics is suppressed with high reliability.

Moreover, according to the method of manufacturing the thin-film transistor as above, a thin-film transistor in which the novel composite metal oxide is used for the semiconductor layer and change in characteristics is suppressed can be easily manufactured.

EXAMPLES

While [Thin-Film Transistor of First Embodiment], [Thin-Film Transistor of Second Embodiment], [Embodiment of Method for Manufacturing Thin-Film Transistor] and [Thin-Film Transistor of Third Embodiment] as above are hereafter described with Examples, the present invention is not limited to these Examples.

First Example

Figure 4:
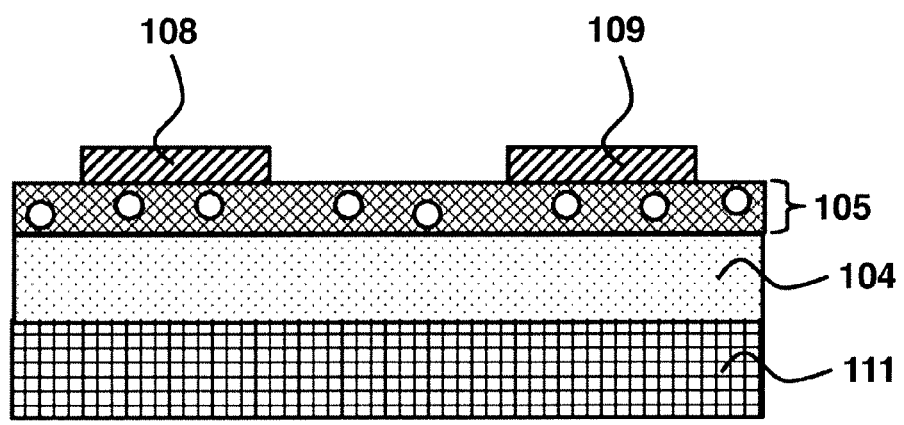
FIG. 4 is a schematic cross-sectional view of thin-film transistors of First, Second and Third Examples of the present invention.

In the present example, a thin-film transistor illustrated in FIG. 4 was fabricated and the operation was confirmed. The thin-film transistor illustrated in the figure has the similar configuration to that of the thin-film transistor 101 illustrated in FIG. 1, and has a configuration in which a Si layer 111 doped with a large amount of p-type impurity is used instead of the gate electrode 103 included in the thin-film transistor 101 of FIG. 1.

The thin-film transistor of the present example was manufactured by forming the insulating layer 104 using a Si substrate doped with p-type impurity by oxidizing its surface, and after that, forming the semiconductor layer 105 on the surface of the insulating layer 104 using a method mentioned later. The source electrode 108 and the drain electrode 109 were formed by mask deposition on the surface of the semiconductor layer 105.

The source electrode 108 and the drain electrode 109 had gold (Au) as the forming material and their thickness was 50 nm. Moreover, the separation distance (gate length) between the source electrode 108 and the drain electrode 109 was 350 μm and the portion in which they opposed each other was 940 μm.

For the semiconductor layer 105, film deposition was performed using a sputtering apparatus and using an In—Si—O target as the target material in the sputtering method (DC sputtering) under the conditions below. As the In—Si—O target, a 1 wt % Si-added In-based sample article was used. The thickness of the semiconductor layer 105 obtained by the film deposition was 20 nm.

Figure 5:
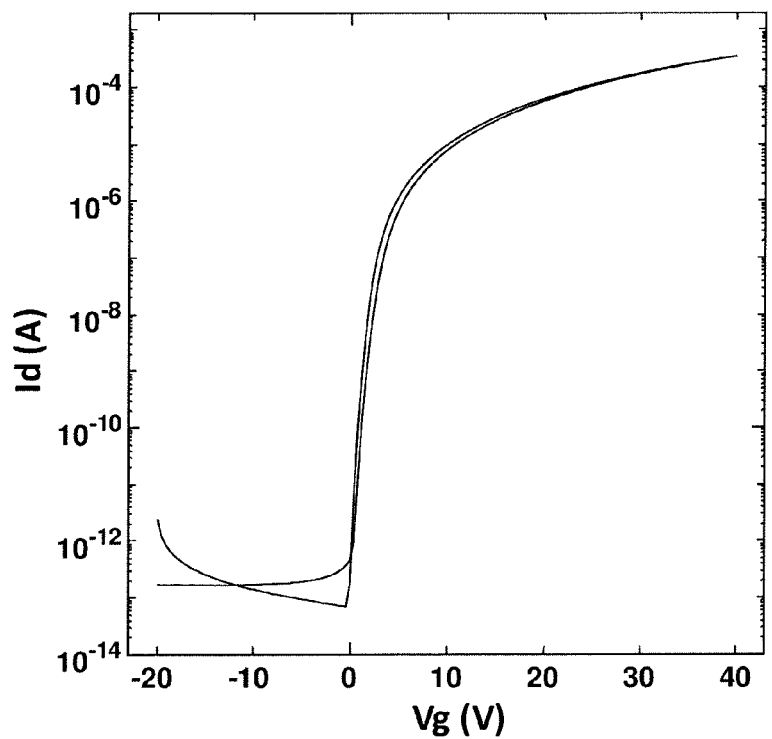
FIG. 5 is a diagram illustrating results of Id-Vg characteristics measurement for an In—Si—O semiconductor layer of First Example of the present invention.
Figure 6:
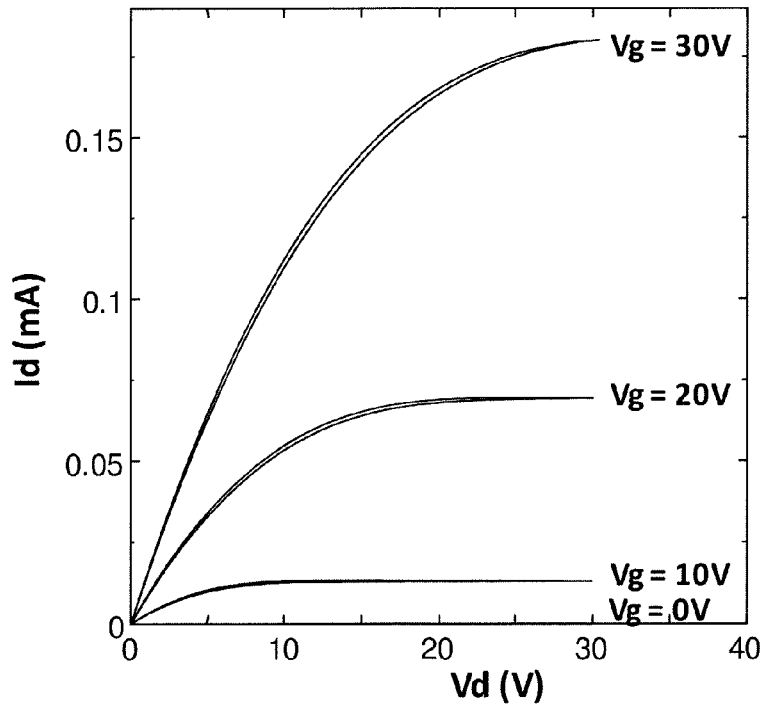
FIG. 6 is a diagram illustrating results of Id-Vd characteristics measurement for the In—Si—O semiconductor layer of First Example of the present invention.

(Sputtering Conditions)
DC power: 50 W
Degree of Vacuum: 0.08 Pa
Process Gas Flow Rate: Ar 3 sccm/$O_2$ 0.5 sccm
(sccm: Standard Cubic Centimeter per Minute)
Substrate Temperature: 25° C.; No Heating The characteristics of the thin-film transistor fabricated as above were measured with the evaluation environment being dark at 25° C. under a vacuum. FIG. 5 and FIG. 6 are graphs illustrating the results obtained by measuring the characteristics of the thin-film transistor of the present invention. FIG. 5 and FIG. 6 illustrate transfer characteristics and output characteristics, respectively. FIG. 5 presents the transfer characteristics of the drain current in the case where the gate voltage was applied from negative to positive, and then, from positive to negative, and FIG. 6 presents the output characteristics of the drain current in the case where the drain voltage was applied to increase from 0 V and resume again to 0 V.

Figure 7:
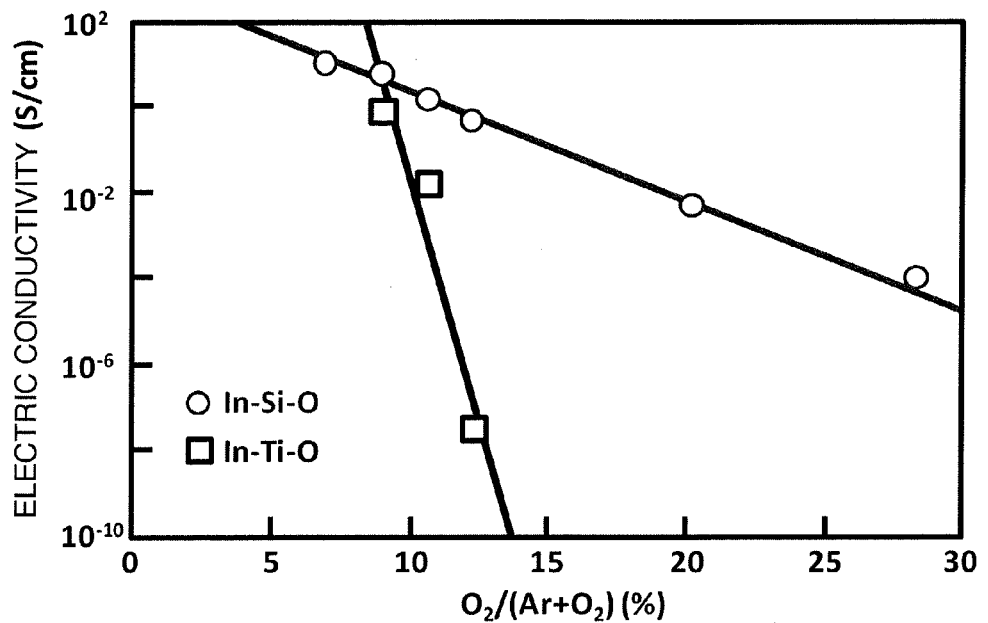
FIG. 7 is a diagram illustrating relation between an $O_2/(O_2+Ar)$ ratio and a conductivity in sputtering deposition of two kinds of semiconductor materials of First Example of the present invention.

Moreover, FIG. 7 presents the characteristics of electric conduction of In—Si—O-based and In—Ti—O-based thin-film transistors in the case where the ratio of $O_2/(Ar+O_2)$ was varied in a range of 5 to 25% under the aforementioned sputtering conditions. In—Si—O presents the more excellent electric conductivity as compared with In—Ti—O in all of the oxygen ratios in FIG. 7. This is because the oxygen dissociation energy of the Si—O bond (799.6±13.4 kJ/mol) is larger as compared with the oxygen dissociation energy of Ti—O (666.5±5.6 kJ/mol), and the oxygen vacancy amount can be controlled by precisely eliminating suitable oxygen from indium oxide ($In_2O_3$). Moreover, it is indicated that change in electric conductivity characteristics relative to change in ratio of $O_2/(Ar+O_2)$ is smaller for In—Si—O. The results indicate that In—Si—O affords a larger process margin.

Second Example

With respect to the third embodiment of the present invention, a thin-film transistor having a structure corresponding to the thin-film transistor whose basic structure is illustrated in FIG. 4 was fabricated and the operation was confirmed. For the semiconductor layer 105" (refer to FIG. 3) corresponding to the semiconductor layer 105 in FIG. 4, film deposition was performed using a sputtering apparatus and using an In—Si—Yb—O target as the target material in the sputtering method (DC sputtering) under the conditions below. As the In—Si—Yb—O target, a 10 wt % Si and 2 wt % Yb-added In—O-based sample article was used. The thickness of the semiconductor layer 105 obtained by the film deposition was 20 nm.

Figure 8:
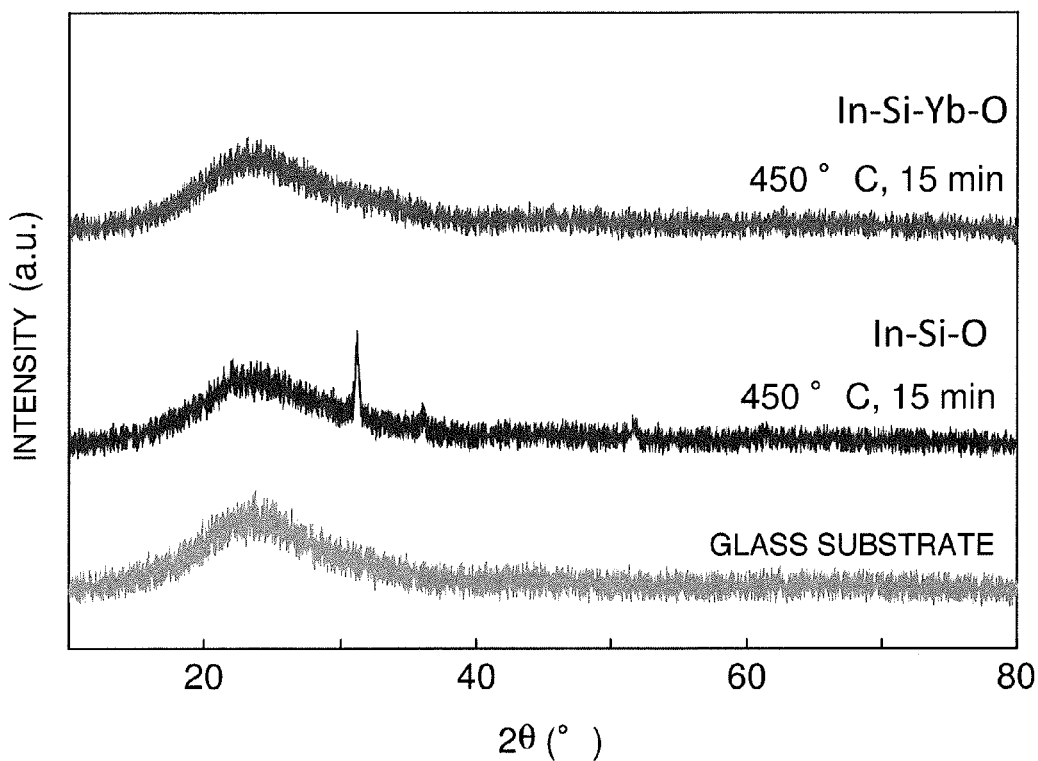
FIG. 8 is a diagram illustrating X-ray diffraction patterns for confirming that a semiconductor film used in Second Example of the present invention is amorphous.

(Sputtering Conditions)
DC power: 100 W
Degree of Vacuum: 0.2 Pa
Process Gas Flow Rate: Ar 20 sccm/$O_2$ 2 sccm
(sccm: Standard Cubic Centimeter per Minute)
Substrate Temperature: 25° C.; No Heating In order to study the crystal structure due to post heating processing of the In—Si—Yb—O film, an In—Si—Yb—O film with a film thickness of 20 nm was fabricated on a glass substrate, and FIG. 8 illustrates an X-ray diffraction pattern after the heat processing in the air at 450° C. for 15 minutes. For comparison, a glass substrate and an In—Si—O film (in other words, a semiconductor film to which the additional oxide is not added) after the heat processing in the air at 450° C. for 15 minutes are also illustrated. It is found that while for the In—Si—O film, the crystal peaks based on $In_2O_3$ are identified, for the In—Si—Yb—O film, no peaks are confirmed, which indicates amorphous one.

Figure 9:
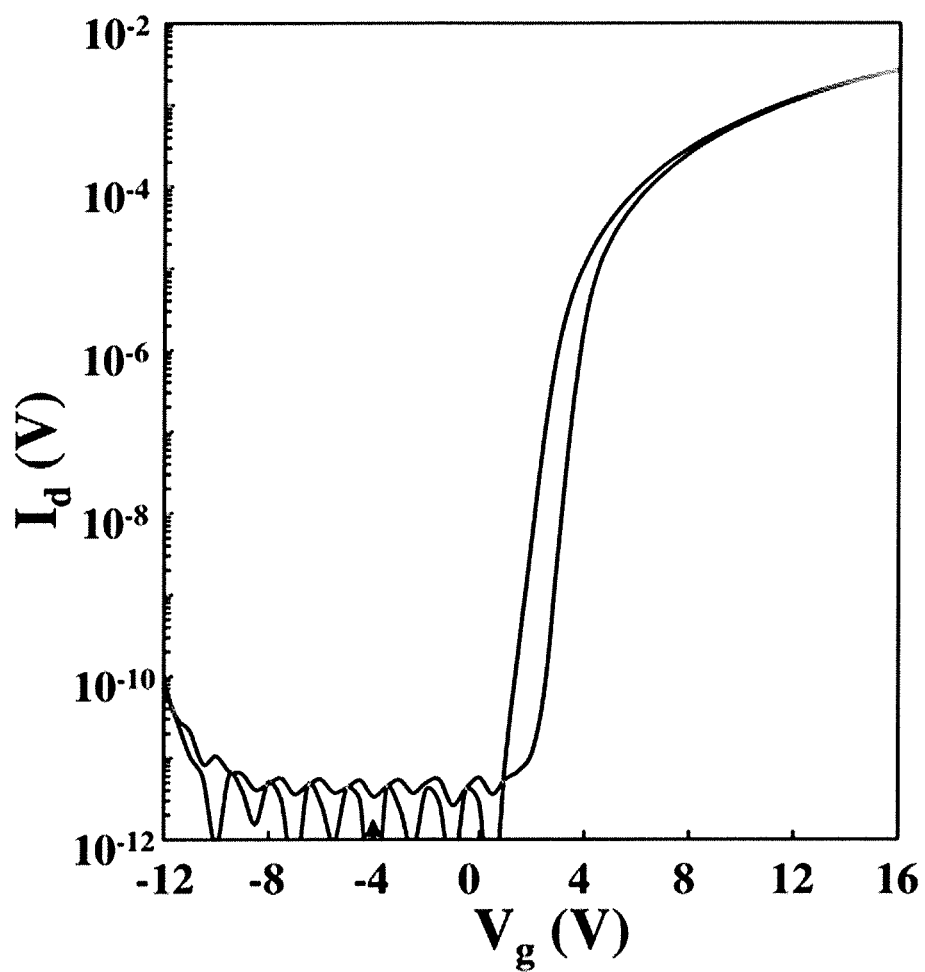
FIG. 9 is a diagram illustrating results of Id-Vg characteristics measurement for a thin-film transistor of Second Example of the present invention.

Moreover, the characteristics of the thin-film transistor fabricated using this amorphous In—Si—Yb—O film were measured with the evaluation environment being dark at 25° C. under a vacuum. FIG. 9 illustrates the results obtained by measuring the characteristics of the thin-film transistor of the present invention. FIG. 9 presents the transfer characteristics of the drain current in the case where the gate voltage was applied from negative to positive, and then, from positive to negative.

Third Example

Furthermore, with respect to the first embodiment of the present invention, a thin-film transistor whose basic structure is illustrated in FIG. 4 was fabricated and the operation was confirmed. For the semiconductor layer 105 in FIG. 4, film deposition was performed using a sputtering apparatus and using an In—Si—O target as the target material in the sputtering method (DC sputtering) under the conditions below. As the In—Si—O target, a 11.5 wt % $SiO_2$-added In—O-based sample article was used. The thickness of the semiconductor layer 105 obtained by the film deposition was 20 nm.

Figure 10:
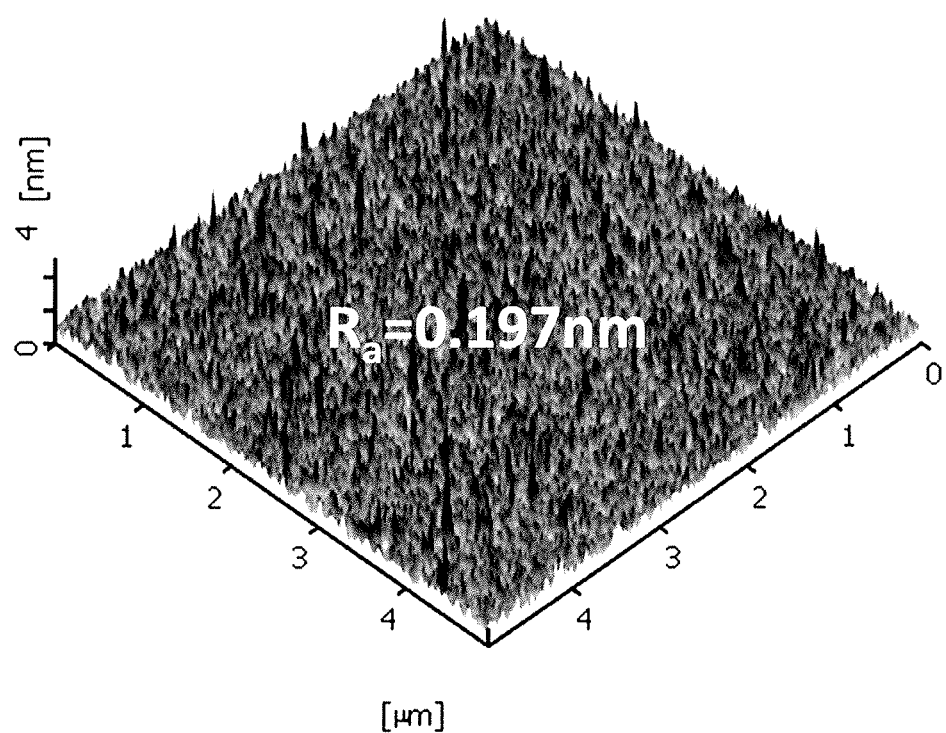
FIG. 10 is a diagram illustrating root mean square roughness (RMS) measured with an atomic force microscope with respect to a semiconductor layer of Third Example of the present invention.

(Sputtering Conditions)
DC power: 200 W
Degree of Vacuum: 0.2 Pa
Process Gas Flow Rate: Ar 7 sccm/$O_2$ 7 sccm
(sccm: Standard Cubic Centimeter per Minute)
Substrate Temperature: 25° C.; No Heating Next, the In—Si—O film obtained by the film deposition underwent heating processing in the air at 600° C. for 1 hour. FIG. 10 illustrates a measurement result of root mean square roughness (RMS) measured by an atomic force microscope with respect to the semiconductor layer 105 after the heating processing. The roughness is small to be 0.197 nm, and further, it was found that from an X-ray diffraction measurement, it remains amorphous without crystallization even after the heating processing at 600° C.

Figure 11:
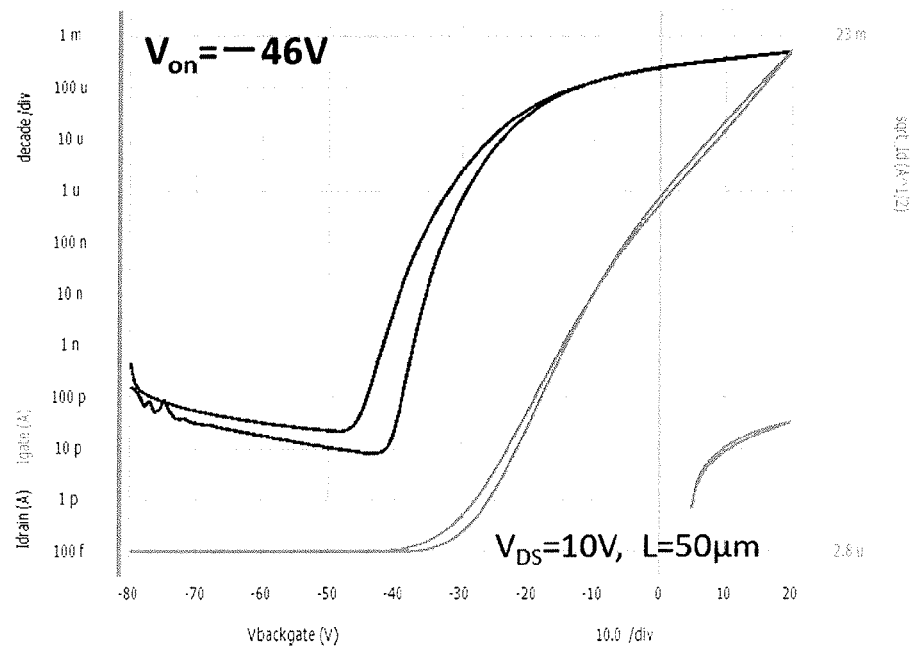
FIG. 11 is a diagram illustrating results of Id-Vg characteristics measurement for a thin-film transistor of Third Example of the present invention before oxygen processing.
Figure 12:
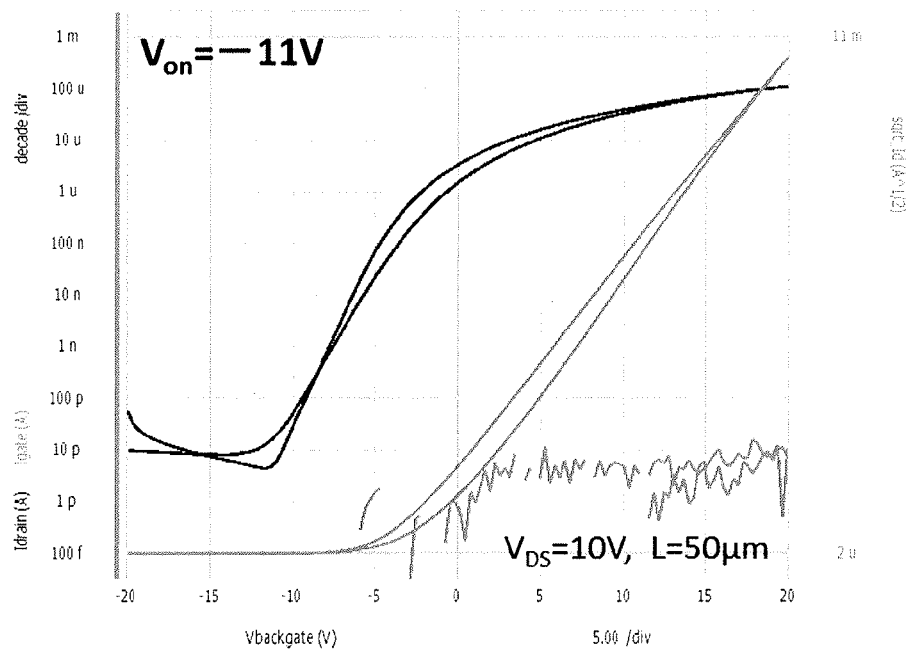
FIG. 12 is a diagram illustrating results of Id-Vg characteristics measurement for the thin-film transistor of Third Example of the present invention after oxygen processing.

After the heating processing at 600° C. as above, source/drain electrodes of Ti/Au were formed to fabricate the thin-film transistor. Next, heating processing was performed at 150° C. for 30 minutes. Moreover, in order to increase dissolved oxygen in the semiconductor layer 105, oxygen processing was performed by introducing ozone from an ozone generator at 150° C. for 15 minutes to fabricate the thin-film transistor. The characteristics of the thin-film transistor having the semiconductor layer 105 which was the amorphous In—Si—O film fabricated as above were measured with the evaluation environment being dark at 25° C. under a vacuum. FIG. 11 presents the transfer characteristics of the drain current in the case where the gate voltage of the thin-film transistor before the oxygen processing was applied from negative to positive, and then, from positive to negative, and FIG. 12 presents the transfer characteristics of the drain current in the case where the gate voltage of the thin-film transistor after the oxygen processing was applied from negative to positive, and then, from positive to negative.

From the results of First Example, Second Example and Third Example as above, the operation of the thin-film transistors of the present invention can be confirmed and the usefulness of the present invention can be confirmed. Moreover, since in Second Example and Third Example, the preferable feature that the semiconductor layer was amorphous was further included, the thin-film transistors with the excellent characteristics were obtained.

[Thin-Film Transistor of Fourth Embodiment]

The present invention is to obtain a thin-film transistor in which the threshold voltage is adjusted, taking advantage of the flat band voltage shifting due to dipoles formed between the $SiO_2$ layer and another dielectric layer in contact therewith. Namely, a dielectric material that gives the flat band voltage shift for a desired threshold voltage or a shift close thereto is selected and used for the aforementioned other dielectric layer.

But, meanwhile, when a material of the gate insulating film is selected, it is required that a high permittivity film with high permittivity be used for the gate insulating film to suppress increase of the leakage current due to reduction of the size of the semiconductor device. Nevertheless, since many dielectric materials that can be used for causing the flat band voltage shift do not have so high permittivity, when the threshold voltage is adjusted with the aforementioned configuration, there is a concern that leakage current characteristics are not sufficient, the same configuration resulting in difficulty of practical applications.

After the present inventors further promoted the studies, it has been found that even when the $SiO_2$ layer and the other dielectric layer in contact therewith are exceedingly thin (specifically, at least approximately 0.6 nm), dipoles are generated at the interface between both to cause sufficient flat band shift. Based on this knowledge, the inventors have come up with the idea that even in the case of setting the gate insulating film to have a $SiO_2$ layer/a dielectric layer that is in contact with the $SiO_2$ layer, and thereby, generates the desired flat band shift/a dielectric layer having high permittivity (specifically, 20 or more) for making the permittivity of the gate insulating film sufficiently high, since the first two layers can be made sufficiently thin, the permittivity of the whole film can maintain its high value without the thickness of the whole gate insulating film being too much, and accordingly, both of threshold voltage control and leakage current suppression can be satisfied, which has completed the present invention.

A thin-film transistor of the present embodiment includes: a source electrode and a drain electrode, a semiconductor layer provided in contact with the source electrode and the drain electrode; a gate electrode provided corresponding to a channel between the source electrode and the drain electrode; and an insulating layer provided between the gate electrode and the semiconductor layer, wherein the insulating layer is a composite metal oxide composed of layer stack of, in order from the gate electrode side, a silicon oxide layer, a high-permittivity first layer having permittivity that is higher than that of the silicon oxide layer, and a high-permittivity second layer having permittivity that is higher than that of the silicon oxide layer.

Moreover, a method of manufacturing the thin-film transistor of the present embodiment has a step of forming the semiconductor layer at 10° C. or more and 400° C. or less when manufacturing the aforementioned thin-film transistor.

Figure 13:
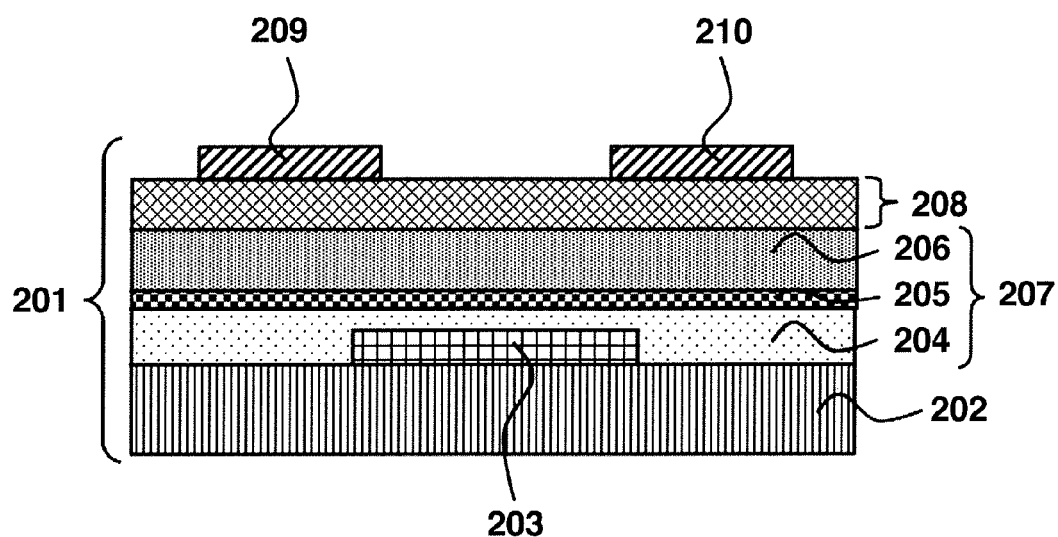
FIG. 13 is a schematic cross-sectional view of a thin-film transistor according to a fourth embodiment of the present invention.

FIG. 13 is a schematic cross-sectional view of a thin-film transistor 201 according to the present embodiment. As a substrate 202, one formed of a known forming material can be used, and any of one having light transmissivity and one not having light transmissivity can be used. For example, an inorganic substrate having a forming material such as alkali silicate-based glass, quartz glass and silicon nitride; a silicon substrate; a metal substrate whose surface undergoes insulation processing; a resin substrate having a forming material such as polyester resin such as acrylic resin, polycarbonate resin, PET (poly(ethylene terephthalate)) and PBT (poly(butylene terephthalate)); and a paper-made substrate are variously used. Moreover, it is sufficient to be a substrate having a forming material such as a composite material obtained by combining these materials. The thickness of the substrate 202 can be properly configured depending on its design.

The thin-film transistor 201 is a so-called bottom-gate transistor. The thin-film transistor 201 has a gate electrode 203 provided on the substrate 202, an insulating layer 207 provided to cover the gate electrode 203, a semiconductor layer 208 provided on the upper surface of the insulating layer 207, and a source electrode 209 and a drain electrode 210 provided on the upper surface of the semiconductor layer 208 to be in contact with the semiconductor layer 208. The gate electrode 203 is provided corresponding to a channel region of the semiconductor layer 208 (at a position of planarly overlapping with the channel region). Moreover, the insulating layer 207 is composed of layer stack of a silicon oxide layer 204, a high-permittivity first layer 205 having permittivity higher than that of the silicon oxide layer, and a high-permittivity second layer 206 having permittivity higher than that of the silicon oxide layer. Notably, the insulating layer 207 may contain a component other than the high-permittivity first layer 205 and the high-permittivity second layer 206 and an irresistible impurity in the nature of things as long as the operation and the effect of the present invention do not suffer exceedingly harmful influence.

Figure 14:
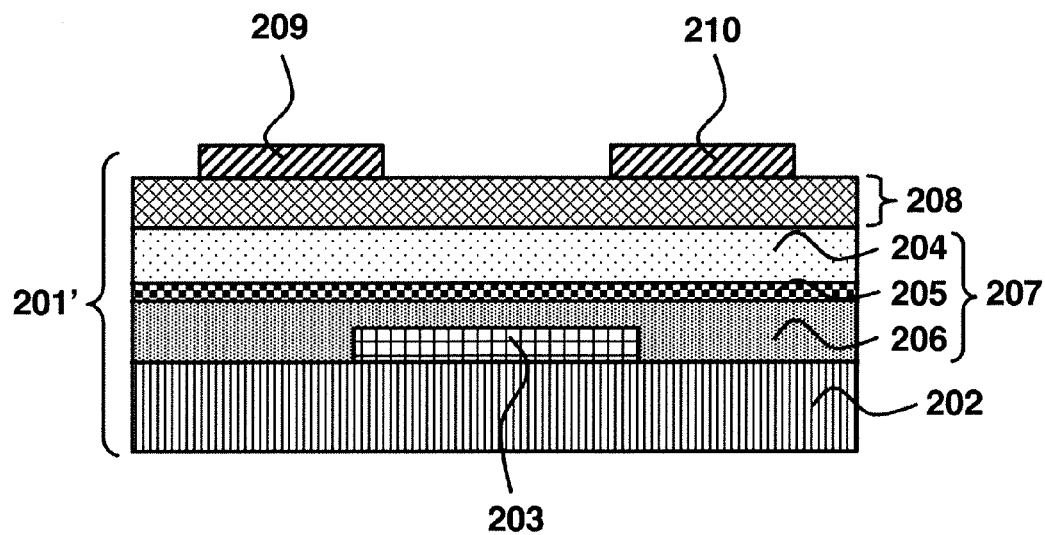
FIG. 14 is a schematic cross-sectional view of another thin-film transistor according to the fourth embodiment of the present invention.

FIG. 14 illustrates a thin-film transistor 201' according to another of the present embodiment. Herein, the elements corresponding to or similar to the elements illustrated in FIG. 13 are given the same reference numerals in FIG. 13. The thin-film transistor, same as in FIG. 13, is a bottom-gate transistor, and has the gate electrode 203 provided on the substrate 202, the insulating layer 207 provided to cover the gate electrode 203, the semiconductor layer 208 provided on the upper surface of the insulating layer 207, and the source electrode 209 and the drain electrode 210 provided on the upper surface of the semiconductor layer 208 to be in contact with the semiconductor layer 208. The gate electrode 203 is provided corresponding to the channel region of the semiconductor layer 208 (at the position of planarly overlapping with the channel region). Moreover, the insulating layer 207 is composed of layer stack of, in the order from the gate electrode side, the high-permittivity second layer 206 having the permittivity higher than that of the silicon oxide layer, the high-permittivity first layer 205 having the permittivity higher than that of the silicon oxide layer, and the silicon oxide layer 204.

In any of the thin-film transistors, as the gate electrode 203, the source electrode 209 and the drain electrode 210, ones formed of a typically known material can be used. Examples of the forming material of these electrodes can include, for example, a metal material such as aluminum (Al), gold (Au), silver (Ag), copper (Cu), nickel (Ni), molybdenum (Mo), tantalum (Ta) and tungsten (W), alloy of these, and conductive oxide such as indium tin oxide (ITO) and zinc oxide (ZnO). Moreover, in these electrodes, for example, a layered structure of two or more layers may be formed by plating their surfaces with a metal material.

The gate electrode 203, the source electrode 209 and the drain electrode 210 may be ones formed of the same forming material, or may be ones formed of different forming materials. For the reason that they are easily manufactured, the source electrode 209 and the drain electrode 210 preferably have the same forming material.

For the semiconductor layer 208, oxide semiconductor which generates electrons by introducing oxygen vacancy, such as In—Zn—O-based, In—Ga—Zn—O-based, Sn—Zn—O(SZO)-based, In—Si—O-based, In—Ti—O-based and In—W—O-based ones obtained by adding various elements to indium oxide ($In_2O_3$), can be used. Metal oxide obtained by adding various elements to titanium oxide ($TiO_2$) that does not use indium oxide ($In_2O_3$) can be used as long as it generates electrons.

Figure 15A:
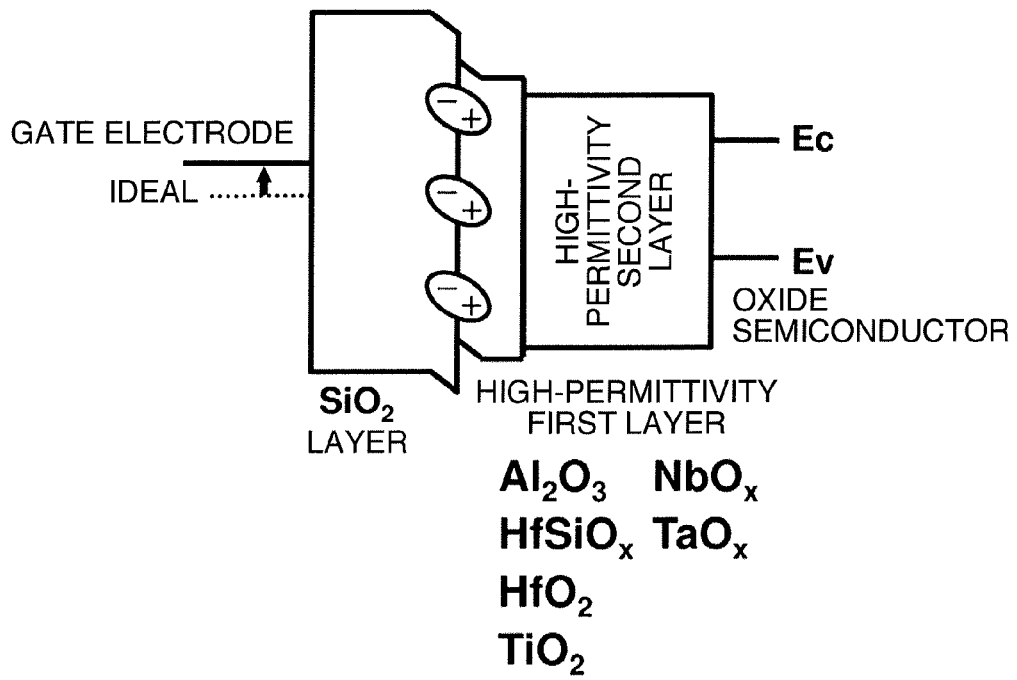
FIG. 15A is a band chart illustrating dipoles of Vth shift to the negative direction in the thin-film transistor according to the fourth embodiment of the present invention.

The insulating layer 207 corresponding to the thin-film transistor 201 is composed of the silicon oxide layer 204, the high-permittivity first layer 205 having permittivity higher than that of silicon oxide, and the high-permittivity second layer 206 having permittivity higher than that of silicon oxide. As illustrated in FIG. 15A, in the insulating layer composed of the silicon oxide layer, the high-permittivity first layer and the high-permittivity second layer in the order from the gate electrode side, in order to afford dipoles which are negative on the silicon oxide side and positive on the high-permittivity first layer side at the interface of the silicon oxide layer/the high-permittivity first layer, it is excellent to use metal oxide, for example, of aluminum oxide, hafnium silicate oxide, hafnium oxide, titanium oxide, tantalum oxide or niobium oxide as a material of the high-permittivity first layer. A composite material of the aforementioned metal oxides is also excellent. Moreover, the high-permittivity first layer may be a silicate oxide film or a silicon oxynitride film containing the aforementioned element.

Figure 15B:
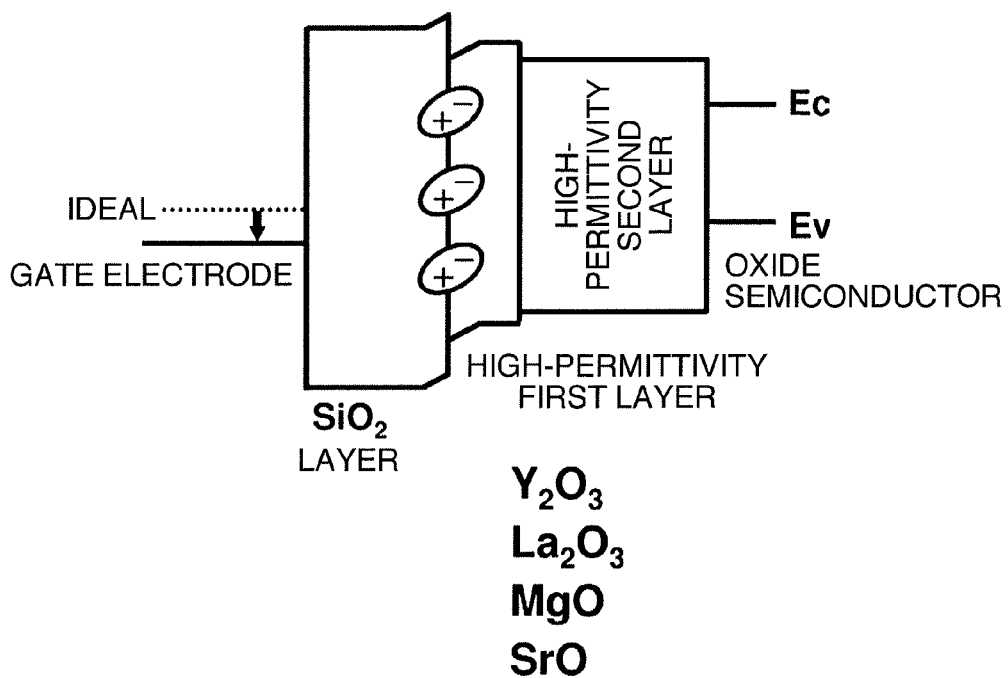
FIG. 15B is a band chart illustrating dipoles of Vth shift to the positive direction in the thin-film transistor according to the fourth embodiment of the present invention.

Moreover, as illustrated in FIG. 15B, in the insulating layer composed of the silicon oxide layer, the high-permittivity first layer and the high-permittivity second layer in the order from the gate electrode side, in order to afford dipoles which are positive on the silicon oxide side and negative on the high-permittivity first layer side at the interface of the silicon oxide layer/the high-permittivity first layer, it is excellent to use metal oxide, for example, of yttrium oxide, lanthanum oxide, magnesium oxide, strontium oxide or rare-earth oxide as a material of the high-permittivity first layer. A composite material of the aforementioned oxides is also excellent. Moreover, the high-permittivity first layer may be a silicate oxide film or a silicon oxynitride film containing the aforementioned element.

Figure 16A:
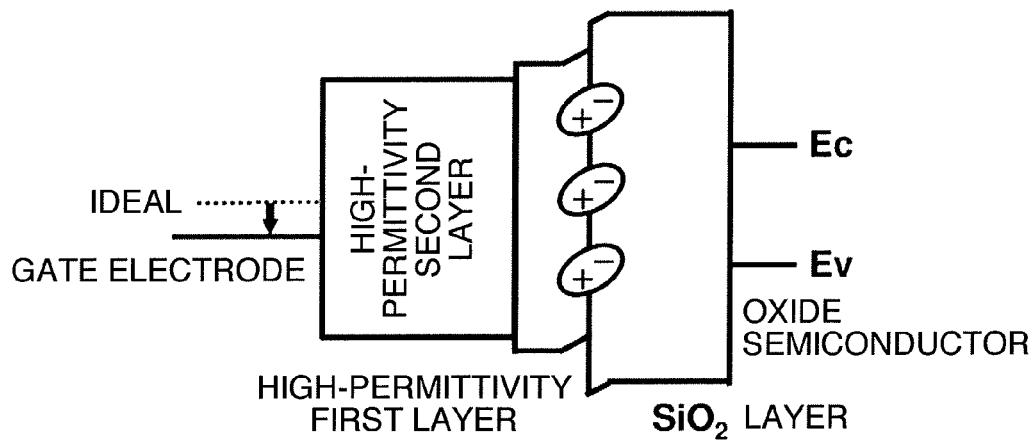
FIG. 16A is a band chart illustrating dipoles of Vth shift to the positive direction in the other thin-film transistor according to the fourth embodiment of the present invention.

For the insulating layer 207 corresponding to the thin-film transistor 201', as illustrated in FIG. 16A, in the insulating layer composed of the high-permittivity second layer, the high-permittivity first layer and the silicon oxide layer in the order from the gate electrode side, in order to afford dipoles which are negative on the silicon oxide side and positive on the high-permittivity first layer side at the interface of the silicon oxide layer/the high-permittivity first layer, it is excellent to use metal oxide, for example, of aluminum oxide, hafnium silicate oxide, hafnium oxide, titanium oxide, tantalum oxide or niobium oxide as a material of the high-permittivity first layer. A composite material of the aforementioned metal oxides is also excellent. Moreover, the high-permittivity first layer may be a silicate oxide film or a silicon oxynitride film containing the aforementioned element.

Figure 16B:
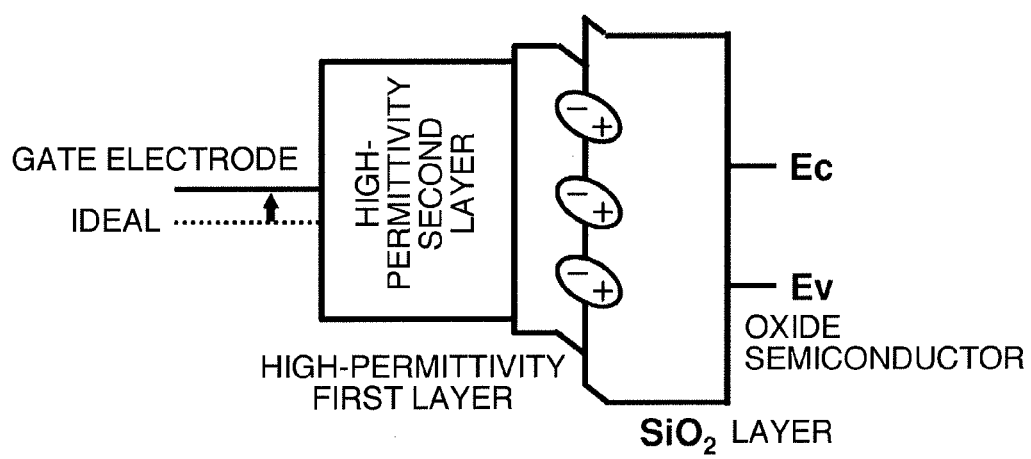
FIG. 16B is a band chart illustrating dipoles of Vth shift to the negative direction in the other thin-film transistor according to the fourth embodiment of the present invention.

Moreover, as illustrated in FIG. 16B, in the insulating layer composed of the high-permittivity second layer, the high-permittivity first layer and the silicon oxide layer in the order from the gate electrode side, in order to afford dipoles which are positive on the silicon oxide side and negative on the high-permittivity first layer side at the interface of the silicon oxide layer/the high-permittivity first layer, it is excellent to use metal oxide, for example, of yttrium oxide, lanthanum oxide, magnesium oxide, strontium oxide or rare-earth oxide as a material of the high-permittivity first layer. A composite material of the aforementioned oxides is also excellent. Moreover, the high-permittivity first layer may be a silicate oxide film or a silicon oxynitride film containing the aforementioned element.

The direction of the dipoles generated at the interface of the silicon oxide layer/the high-permittivity first layer is determined by the difference between the densities of the oxygen concentrations caused by crystal structures of both layers at the interface. When the oxygen concentration on the high-permittivity first layer side is smaller, negative oxygen ions on the silicon oxide side move to the high-permittivity first layer, and as a result, the direction of the dipoles is negative on the high-permittivity first layer side and positive on the silicon oxide side. Meanwhile, when the oxygen concentration on the high-permittivity first layer side is larger, negative oxygen ions on the high-permittivity first layer side move to the silicon oxide side, and as a result, the direction of the dipoles is positive on the high-permittivity first layer side and negative on the silicon oxide side.

In order to suppress the gate leakage current by making the physical film thickness large with the electric film thickness of the insulating layer remaining small, the high-permittivity second layer is preferably formed of metal oxide with permittivity of 20 or more. This is because many materials of the metal oxide used for the high-permittivity first layer which generates dipoles have permittivity smaller than 20 and are not necessarily suitable for making the physical film thickness large. Examples of the material suitably used for the high-permittivity second layer can include, for example, $TiO_2$ in the rutile structure, and Sr—Ti—O-based, Ba—Ti—O-based and Pb—(Zr/Ti)—O-based metal oxides.

Moreover, the thickness of the high-permittivity first layer is still preferably 0.6 nm or more. This is the film thickness required for generating dipoles between the high-permittivity first layer and the silicon oxide layer, and in FIG. 22 mentioned later, the results of Example regarding relation between the film thickness of an $Al_2O_3$ layer and the threshold voltage are presented.

Furthermore, the thickness of the silicon oxide film is still preferably 0.6 nm or more. This is because dipoles are generated by a silicon oxide film consisting of at least 2 layers or more. Herein, an O—Si—O—Si—O layer is counted as one monolayer in silicon oxide, and that a "silicon oxide film consists of 2 layers or more" means that two or more monolayers of the aforementioned layers are included. Notably, in the case of two monolayers, an O—Si—O—Si—O layer entirely covers the uppermost surface of the Si substrate. In the case of a monolayer, the Si substrate is partially exposed on the surface.

[Method for Manufacturing Thin-Film Transistor of Fourth Embodiment]

Next, a method of manufacturing the thin-film transistor 201 of the fourth embodiment is described. The insulating layer of the thin-film transistor of the present embodiment can be formed, for example, by using a physical deposition method (or a physical vapor growth method).

Herein, examples of the physical deposition method can include a deposition method and a sputtering method. As the deposition method, a vacuum deposition method, a molecular beam deposition method (MBE), an ion plating method, an ion beam deposition method and the like can be exemplarily presented. Moreover, as the sputtering method, a conventional sputtering, a magnetron sputtering, an ion beam sputtering, an ECR (electron cyclotron resonance) sputtering, a reactive sputtering and the like can be exemplarily presented. In the case of using plasma in the sputtering method, a film deposition method such as a reactive sputtering method, a DC (direct current) sputtering method, and a high frequency (RF) sputtering method can be used.

Herein, the high-permittivity first layer can also be formed by using a chemical vapor deposition method. In particular, examples thereof can include an atomic layer deposition method which can control the film thickness in angstrom scale.

Furthermore, one manufactured using the following manufacturing method is preferable. When the following manufacturing method is used, a thin-film transistor with higher quality can be manufactured.

In the method of manufacturing the thin-film transistor 201 of the present embodiment, after the gate electrode 203 is formed on the substrate 202 by a typically known method, the insulating layer 207 composed of the silicon oxide layer 204, the high-permittivity first layer 205 and the high-permittivity second layer 206 is formed, and after that, the semiconductor layer 208 is formed. In the manufacturing method of the present embodiment, the high-permittivity first layer 205 is manufactured by the chemical vapor deposition method using raw material gas and $H_2O$ gas as an oxidizing agent. The description is herein made with the atomic layer deposition method used as the chemical vapor deposition method.

For example, the formation may be performed by the atomic layer deposition method using an $Al_2O_3$ layer as the high-permittivity first layer 205, trimethylaluminum raw material gas, and $H_2O$ gas.

As above, the method of manufacturing the thin-film transistor of the present embodiment has been described.

According to the thin-film transistors of the present invention as exemplified in FIG. 13 and FIG. 14 as above, a shift to the desired threshold voltage can be achieved by using the high-permittivity first layer for the insulating layer formed on the silicon oxide layer.

Moreover, a semiconductor device having the configuration as above has thin-film transistors exhibiting the desired threshold voltage with high reliability.

Moreover, according to the method of manufacturing the thin-film transistor as above, a thin-film transistor in which the threshold voltage is shifted to the desired value can be easily manufactured by using the high-permittivity first layer for the insulating layer formed on the silicon oxide layer.

EXAMPLES

Figure 17:
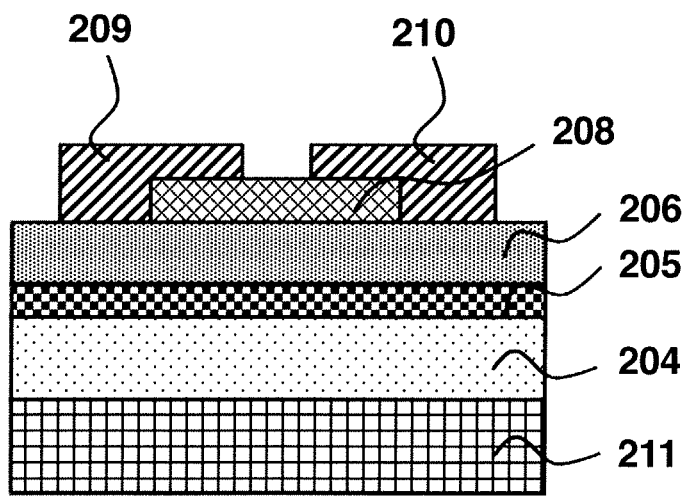
FIG. 17 is a schematic cross-sectional view of Example of a thin-film transistor fabricated for confirming operation in the fourth embodiment.

In the present example, a thin-film transistor illustrated in FIG. 17 was fabricated and the operation was confirmed. The thin-film transistor illustrated in the figure has the similar configuration to that of the thin-film transistor 201 illustrated in FIG. 13, and has a configuration in which a Si layer 211 doped with a large amount of p-type impurity is used instead of the gate electrode 203 included in the thin-film transistor 201 of FIG. 13.

Figure 18:
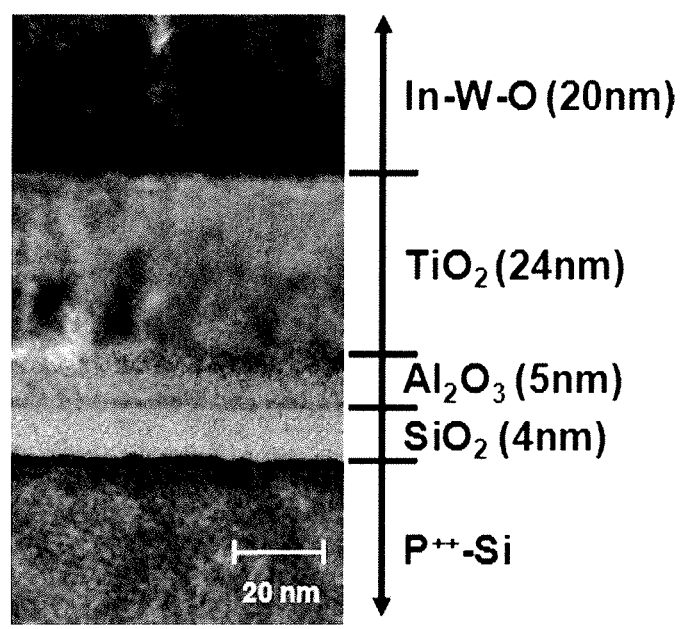
FIG. 18 is a cross-sectional TEM image of Example of the thin-film transistor fabricated for confirming the operation in the fourth embodiment.

FIG. 18 illustrates a cross-sectional TEM image of the thin-film transistor of the present example. After forming the silicon oxide ($SiO_2$) layer 204 by 4 nm by using a Si substrate doped with p-type impurity and oxidizing its surface, film deposition of an $Al_2O_3$ layer as the high-permittivity first layer by 5 nm on the surface of the silicon oxide layer 204 was performed at the film deposition temperature of 200° C. by the atomic layer deposition method using trimethylaluminum raw material gas and $H_2O$ gas. Next, film deposition of a $TiO_2$ layer as the high-permittivity second layer by 24 nm was performed at the film deposition temperature of 200° C. by the atomic layer deposition method using tetradimethylamidetitanium raw material gas and $H_2O$ gas. Next, an In—W—O film was formed as the semiconductor layer 208 by 20 nm using a DC sputtering apparatus and an In—W—O target as the target material at the film deposition temperature of 25° C., Ar 3 sccm/$O_2$ 0.5 sccm, the degree of vacuum of 0.08 Pa, and the DC sputtering power of 50 W. Finally, the source electrode 209 and the drain electrode 210 had aluminum (Al) as the forming material and their thickness was 300 nm. Moreover, the separation distance (gate length) between the source electrode 209 and the drain electrode 210 was 350 μm and the portion in which they opposed each other was 940 μm.

The permittivities of the $Al_2O_3$ film and the $TiO_2$ film were obtained from the relation between the film thicknesses and capacitance-converted film thicknesses of the capacitors, and 8 and 35, respectively. Therefore, the $SiO_2$-converted film thickness of the insulating film, of the thin-film transistor, composed of the $SiO_2$ layer (4 nm)/$Al_2O_3$ layer (5 nm)/$TiO_2$ layer (24 nm) was 9.1 nm. When the leakage current was measured by applying a voltage between Si doped with p-type impurity and the Al source electrode, it exhibited a small current value not more than 1.0 nA even at 40 V. Meanwhile, for the thin-film transistor of the In—W—O film using the insulating film of the $SiO_2$ layer (4 nm)/$Al_2O_3$ layer (10.5 nm) without a $TiO_2$ layer, the $SiO_2$-converted film thickness of the insulating film was 9.1 nm. When the leakage current was measured by applying a voltage between Si doped with p-type impurity and the Al source electrode, it exhibited a large current value not less than 1.0 nA at 20 V. The large difference in leakage current characteristics is caused by the difference in physical film thickness of the insulating films (14.5 nm of the $SiO_2$ layer/$Al_2O_3$ layer relative to 33 nm of the $SiO_2$ layer/$Al_2O_3$ layer/$TiO_2$ layer). This indicates the operation that the physical film thickness can be made thicker as the permittivity of the high-permittivity second layer becomes larger, and as a result, the leakage current can be made smaller.

Moreover, in order to evaluate the effect of the high-permittivity first layer with respect to the control of the threshold voltage, two kinds of thin-film transistors in the presence/absence of the $Al_2O_3$ layer were fabricated. While the two layers, first and second high permittivity layers, are provided in the present invention, only the high-permittivity first layer contributes the generation of dipoles resulting in the threshold voltage shift, which layer is in direct contact with silicon oxide. It is apparent that the presence or absence of the high-permittivity second layer does not affect the generation of dipoles or the threshold voltage shift amount. Accordingly, in order to evaluate the threshold voltage shift effect in the thin-film transistor of the present invention, it is sufficient that the configuration of the insulating layer of the thin-film transistor is simplified and the evaluation is just made for the element formed only of the high-permittivity first layer and the silicon oxide layer.

The thin-film transistor in the presence of the $Al_2O_3$ layer was fabricated in the following procedure. After forming the silicon oxide layer 204 by 15 nm by using a Si substrate doped with p-type impurity and oxidizing its surface, film deposition of an $Al_2O_3$ layer as the high-permittivity first layer by 3 nm on the surface of the silicon oxide layer 204 was performed at the film deposition temperature of 200° C. by the atomic layer deposition method using trimethylaluminum raw material gas and $H_2O$ gas. Next, an In—Ga—Zn—O film was formed as the semiconductor layer 208 by 20 nm using a DC sputtering apparatus and an In—Ga—Zn—O target as the target material at the film deposition temperature of 25° C., Ar 30 sccm/$O_2$ 1.6 sccm, the degree of vacuum of 0.72 Pa, and the DC sputtering power of 100 W. Finally, the source electrode 209 and the drain electrode 210 had aluminum (Al) as the forming material and their thickness was 300 nm. Moreover, the separation distance (gate length) between the source electrode 209 and the drain electrode 210 was 350 μm and the portion in which they opposed each other was 940 μm. Meanwhile, the thin-film transistor in the absence of the $Al_2O_3$ layer was fabricated in the following procedure. The silicon oxide layer 4 was formed by 16 nm by using a Si substrate doped with p-type impurity and oxidizing its surface. Next, an In—Ga—Zn—O film was formed as the semiconductor layer 208 by 20 nm using a DC sputtering apparatus and an In—Ga—Zn—O target as the target material at the film deposition temperature of 25° C., Ar 30 sccm/$O_2$ 1.6 sccm, the degree of vacuum of 0.72 Pa, and the DC sputtering power of 100 W. Finally, the source electrode 209 and the drain electrode 210 had aluminum (Al) as the forming material and their thickness was 300 nm. Moreover, the separation distance (gate length) between the source electrode 209 and the drain electrode 210 was 350 μm and the portion in which they opposed each other was 940 μm.

Figure 19:
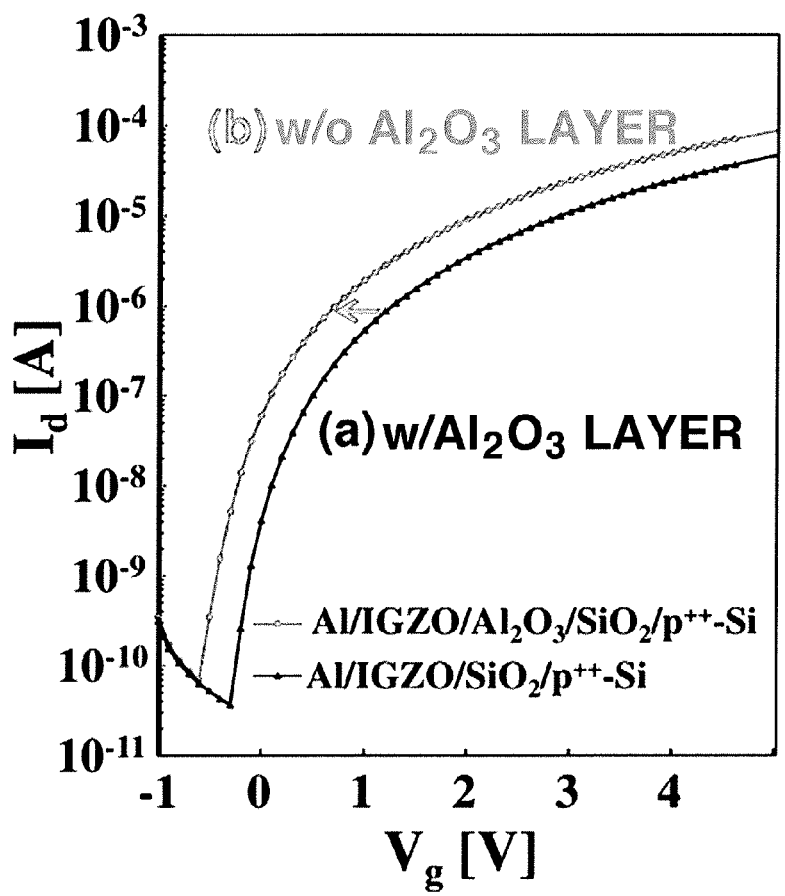
FIG. 19 is a diagram illustrating results of Id-Vg of $p^{++}$-poly-Si/$SiO_2$/$Al_2O_3$/IGZO thin-film transistor in Example of the fourth embodiment.

The characteristics of the two kinds of thin-film transistors fabricated in this way in the presence/absence of the $Al_2O_3$ layer were measured with the evaluation environment being dark at 25° C. under a vacuum. FIG. 19 presents the transfer characteristics of the thin-film transistors. It is found that the Id-Vg curve in the presence of the $Al_2O_3$ layer shifts to the negative direction as compared with that in the absence of the $Al_2O_3$ layer. This shift is caused by the effect of dipoles generated at the interface of the $SiO_2/Al_2O_3$ layers.

Figure 20:
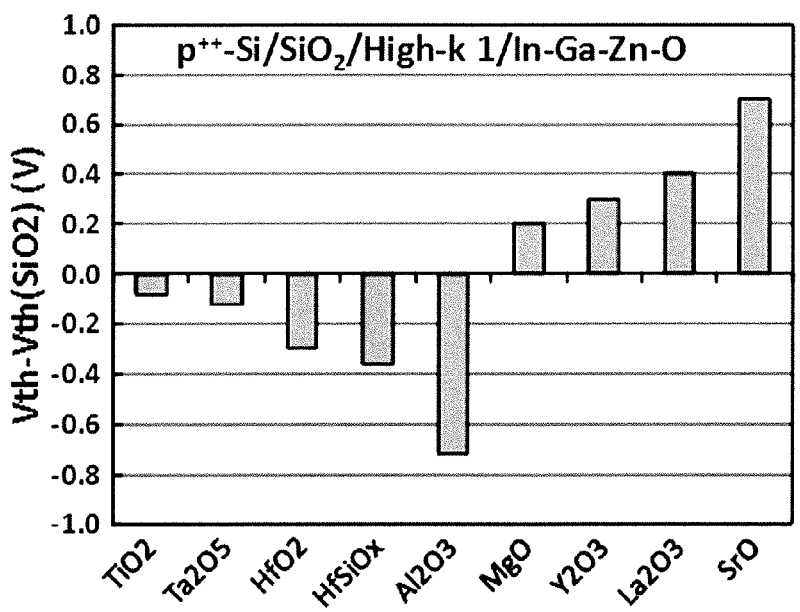
FIG. 20 is a diagram illustrating relation between materials of a high-permittivity first layer in Example of the fourth embodiment and Vth.

As to the structure of the aforementioned thin-film transistor in the presence of the $Al_2O_3$ layer, FIG. 20 shows changes in threshold voltage in the case where a $TiO_2$ layer, a $Ta_2O_5$ layer, a $HfO_2$ layer, a $HfSiO_x$ layer, a MgO layer, an $Y_2O_3$ layer, a $La_2O_3$ layer and a SrO layer were formed to approximately 5 nm by using the RF sputtering method, instead of the $Al_2O_3$ layer. The vertical axis represents the shift of the threshold voltage with respect to the threshold voltage of the thin-film transistor in the case of the absence of the high-permittivity first layer. By using the $TiO_2$ layer, the $Ta_2O_5$ layer, the $HfO_2$ layer and the $HfSiO_x$ layer as the high-permittivity first layer, the threshold voltage shifts to the negative direction similarly to the case of the $Al_2O_3$ layer. The magnitudes thereof are as follows. The $Al_2O_3$ layer>the $HfSiO_x$ layer>the $HfO_2$ layer>the $Ta_2O_5$ layer>the $TiO_2$ layer. Meanwhile, the threshold voltages of the thin-film transistors using the MgO layer, the $Y_2O_3$ layer, the $La_2O_3$ layer and the SrO layer exhibit the shift to the positive direction, and the magnitudes thereof are as follows. The SrO layer>the $La_2O_3$ layer>the $Y_2O_3$ layer>the MgO layer.

Figure 21:
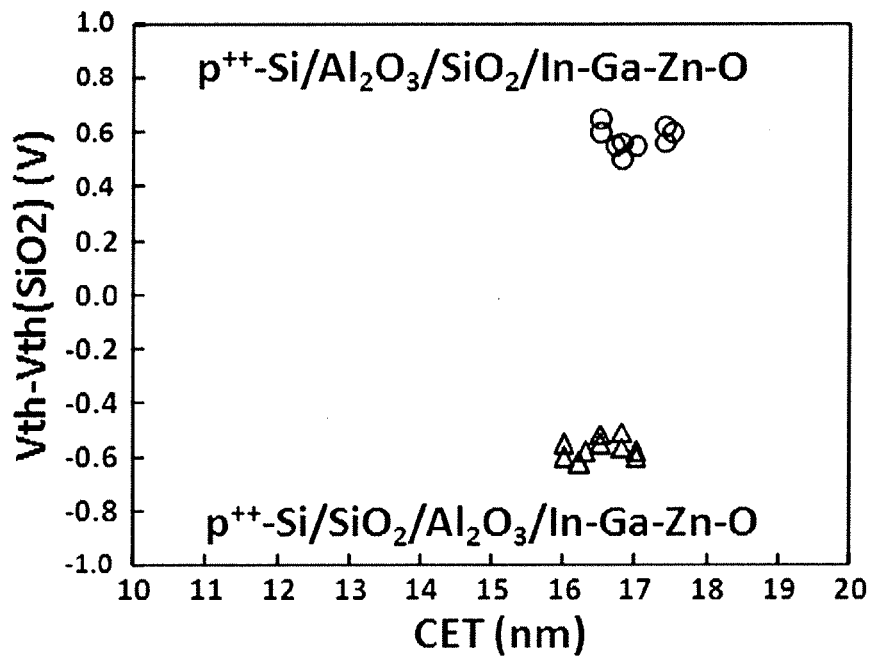
FIG. 21 is a diagram illustrating relation between insertion points of the high-permittivity first layer in Example of the fourth embodiment and Vth.

Furthermore, thin-film transistors which had the similar configuration to that of the thin-film transistor 201' illustrated in FIG. 14 and used a Si substrate doped with p-type impurity as the gate electrode were fabricated by the following method. After performing film deposition of a $Al_2O_3$ layer with the film thickness of 3 nm on the Si substrate doped with p-type impurity in the atomic layer deposition method, a $SiO_2$ layer with the film thickness of 28 nm was formed in the organometal chemical growth method using tetraethoxysilane gas. Next, an In—Ga—Zn—O film was formed as the semiconductor layer 208 by 20 nm using a DC sputtering apparatus and an In—Ga—Zn—O target as the target material at the film deposition temperature of 25° C., Ar 30 sccm/$O_2$ 1.6 sccm, the degree of vacuum of 0.72 Pa, and the DC sputtering power of 100 W. Finally, the source electrode 209 and the drain electrode 210 had aluminum (Al) as the forming material and their thickness was 300 nm. Moreover, the separation distance (gate length) between the source electrode 209 and the drain electrode 210 was 350 μm and the portion in which they opposed each other was 940 μm. FIG. 21 presents the relation between the capacitance equivalent thicknesses (CET) of the insulating layers of the $Al_2O_3$ layer and the $SiO_2$ layer and the threshold voltage normalized based on the threshold voltage of the thin-film transistor in the absence of the $Al_2O_3$ layer. As presented above, while the threshold voltage of the Si doped with p-type impurity/$SiO_2/Al_2O_3$ structure shifts to the negative direction, the threshold voltage of the Si doped with p-type impurity/$Al_2O_3/SiO_2$ structure shifts to the positive direction. In view of the direction of the shift of the threshold voltage, it becomes apparent that this is caused by the direction of dipoles at the $Al_2O_3/SiO_2$ interface.

Figure 22:
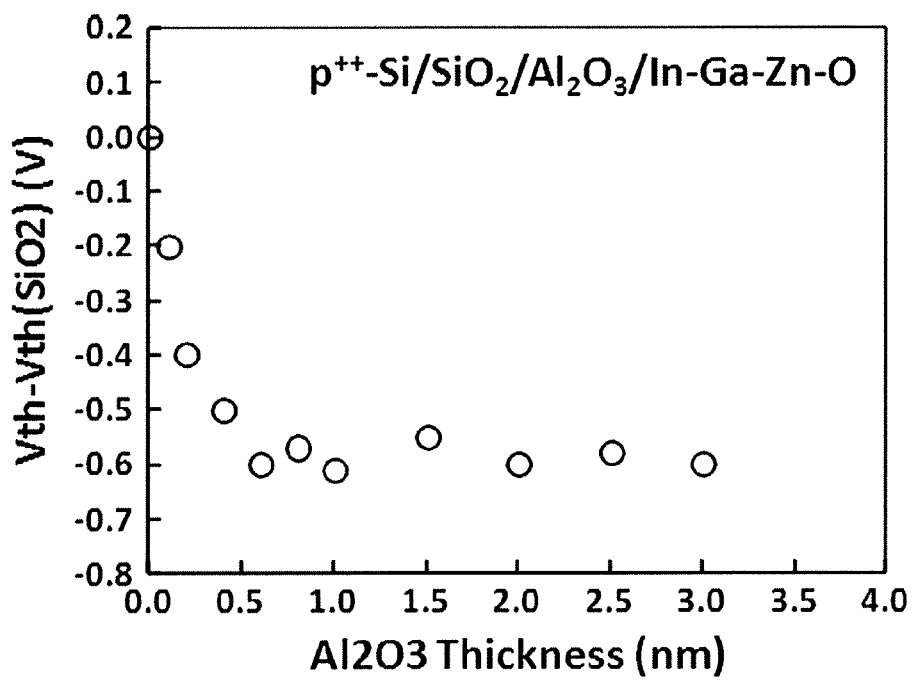
FIG. 22 is a diagram illustrating relation between film thicknesses of an $Al_2O_3$ film in Example of the fourth embodiment and Vth.

In order to study the effectiveness of the film thickness of the high-permittivity first layer, when thin-film transistors having the Si doped with p-type impurity/$SiO_2/Al_2O_3$/In—Ga—Zn—O structure were fabricated, the film thickness of the $Al_2O_3$ layer was adjusted in a range of 0.1 to 3.0 nm by varying the cycle number of the atomic layer deposition method. FIG. 22 presents the relation between the film thickness of the $Al_2O_3$ layer and the threshold voltage normalized based on the threshold voltage of the thin-film transistor in the absence of the $Al_2O_3$ layer. It is found that as the film thickness of the $Al_2O_3$ layer increases, a negative shift is caused in the threshold voltage and the shift saturates when the film thickness reaches 0.6 nm or more. Notably, with other dielectric materials, the film thickness that causes the saturation of the shift amount was approximately 0.6 nm, the same as that in the case of $Al_2O_3$.

Since the aforementioned shift amount maintains the constant value even when the high-permittivity first layer is made further thicker over this saturated film thickness, the film thickness does not have an upper limit in view of shifting the threshold voltage, which is the purpose of this layer. It should be noted that since when the high-permittivity first layer is made thicker with the equivalent oxide film thickness of the insulating film being constant, the high-permittivity second layer, which have higher permittivity, is needed to be made thinner, the permittivity of the whole insulating film decreases, and as a result, the whole insulating film is to become thinner, which causes increase of the leakage current. Accordingly, the thicknesses of these layers are properly determined based on various factors such as convenience of the manufacturing process, materials to be used, and the magnitude of allowable leakage current.

From the results above, the operation of the thin-film transistor of the present invention has been able to be confirmed and the usefulness of the present invention has been able to be confirmed.

Notably, while in the aforementioned various embodiments, the so-called bottom-gate thin-film transistors are described, the present invention can also be applied to so-called top-gate thin-film transistors.

Moreover, while in the aforementioned various embodiments, the so-called top-contact thin-film transistors are described, the present invention can also be applied to so-called bottom-contact thin-film transistors.

While the suitable examples of the embodiments according to the present invention are described above, it is apparent to the skilled in the art that the present invention is not limited to those, but various modifications and corrections may occur within the spirit of the present invention and the appended claims.

INDUSTRIAL APPLICABILITY

As described above, according to the present invention, a semiconductor layer of composite metal oxide in which the oxygen vacancy amount is controlled can be achieved, and the semiconductor layer can be made amorphous up to the higher region of the temperature in the occasion when the semiconductor layer is formed than conventional. Therefore, it can largely contribute to improvement in performance of the thin-film transistor. Moreover, controllability over the threshold voltage can be achieved with substantially no influence on the permittivity of the gate insulating film made of a high permittivity dielectric material. Therefore, it can largely contribute to improvement in performance of the thin-film transistor.

REFERENCE SIGNS LIST

101 Thin-film transistor
101' Thin-film transistor
101" Thin-film transistor
102 Substrate
103 Gate electrode
104 Insulating layer
105 Semiconductor layer
105' Semiconductor layer
105" Semiconductor layer
106 First metal oxide
107 Second metal oxide
108 Source electrode
109 Drain electrode
110 Oxide of boron and/or carbon
111 Si substrate doped with p-type impurity
112 Third metal oxide
201 Thin-film transistor
201' Thin-film transistor
202 Substrate
203 Gate electrode
204 Silicon oxide layer
205 High-permittivity first layer
206 High-permittivity second layer
207 Insulating layer
208 Semiconductor layer
209 Source electrode
210 Drain electrode
211 Si substrate doped with p-type impurity

The invention claimed is:

1. A thin-film transistor comprising:
a source electrode and a drain electrode;
a semiconductor layer provided in contact with the source electrode and the drain electrode;
a gate electrode provided corresponding to a channel between the source electrode and the drain electrode; and
an insulating layer provided between the gate electrode and the semiconductor layer,
wherein the insulating layer has a layer stack arranged in an order of, from the gate electrode side or the semiconductor layer side, a silicon oxide layer, a high-permittivity first layer provided in contact with the silicon oxide layer and having a permittivity higher than that of the silicon oxide layer, and a high-permittivity second layer having a permittivity higher than that of the high-permittivity first layer.

2. The thin-film transistor according to claim 1, wherein the high-permittivity first layer is formed of at least one metal oxide selected from the group consisting of aluminum oxide, hafnium oxide, zirconium oxide, titanium oxide, tantalum oxide, niobium oxide, rare-earth oxide, magnesium oxide and strontium oxide, silicate oxide or silicon oxynitride.

3. The thin-film transistor according to claim 1, wherein a thickness of the high-permittivity first layer is 0.6 nm or more.

4. The thin-film transistor according to claim 1, wherein a thickness of the silicon oxide film is 0.6 nm or more.

* * * * *